(12) United States Patent
Warburton et al.

(10) Patent No.: US 6,587,814 B1
(45) Date of Patent: Jul. 1, 2003

(54) METHOD AND APPARATUS FOR IMPROVING RESOLUTION IN SPECTROMETERS PROCESSING OUTPUT STEPS FROM NON-IDEAL SIGNAL SOURCES

(75) Inventors: William K. Warburton, 1300 Mills St., Menlo Park, CA (US) 94025; Michael Momayezi, San Francisco, CA (US)

(73) Assignee: William K. Warburton, Menlo Park, CA (US)

( * ) Notice: Subject to any disclaimer, the term of this patent is extended or adjusted under 35 U.S.C. 154(b) by 339 days.

(21) Appl. No.: 09/643,705

(22) Filed: Aug. 21, 2000

Related U.S. Application Data

(60) Provisional application No. 60/151,020, filed on Aug. 27, 1999.

(51) Int. Cl.[7] .................. H04B 15/00; G01D 15/00
(52) U.S. Cl. .................. 702/190; 702/57; 702/85
(58) Field of Search .............. 702/32, 57, 70, 702/85, 86, 89, 90, 99, 116, 117, 123, 124, 189–191, 194, 195, 197; 505/161, 162; 250/366.2, 370.01, 252.1

(56) References Cited

U.S. PATENT DOCUMENTS

| | | | |
|---|---|---|---|
| 4,314,343 A | | 2/1982 | Tomlinson .................. 702/32 |
| 4,529,308 A | * | 7/1985 | Rife .......................... 356/323 |
| 4,554,633 A | * | 11/1985 | Glover et al. ............... 378/4 |
| 4,727,256 A | | 2/1988 | Kumazawa ................. 250/370 |
| 4,853,538 A | * | 8/1989 | Jackson ..................... 250/336.2 |
| 4,893,018 A | | 1/1990 | Saitou ........................ 250/370.1 |
| 4,937,452 A | | 6/1990 | Simpson et al. ........... 250/370.06 |
| 4,968,889 A | | 11/1990 | Hartwell et al. .......... 250/336.1 |
| 5,021,664 A | | 6/1991 | Hinshaw ..................... 250/252.1 |
| 5,132,963 A | * | 7/1992 | Ungerboeck ............... 370/286 |
| 5,347,129 A | | 9/1994 | Miller et al. .............. 250/336.1 |
| 5,684,850 A | | 11/1997 | Warburton et al. ......... 378/63 |
| 5,774,522 A | | 6/1998 | Warburton .................. 378/91 |
| 5,821,533 A | * | 10/1998 | Bingham et al. .......... 250/252.1 |
| 5,872,363 A | * | 2/1999 | Bingham et al. .......... 250/363.01 |
| 5,873,054 A | * | 2/1999 | Warburton et al. ....... 250/370.06 |
| 5,889,869 A | * | 3/1999 | Botros et al. ............. 381/71.1 |
| 6,310,349 B1 | * | 10/2001 | Wong et al. ............... 250/363.09 |
| 6,374,192 B1 | * | 4/2002 | Brogle et al. ............. 250/363.01 |

FOREIGN PATENT DOCUMENTS

JP    2000316072 A  * 11/2000 ............ H04N/1/04

OTHER PUBLICATIONS

Aalseth et al., "Using pulse shape discrimination to sort individual energy deposition events in a germanium crystal", Journal of Radioanalytical and Nuclear Chemistry, vol. 233, Nos 1–2 (1998) 119–123.

(List continued on next page.)

*Primary Examiner*—Marc S. Hoff
*Assistant Examiner*—Manuel L. Barbee
(74) *Attorney, Agent, or Firm*—Townsend and Townsend and Crew LLP

(57) ABSTRACT

A method and apparatus for processing step-like output signals generated by non-ideal, nominally single-pole ("N-1P") devices responding to possibly time-varying, pulse-like input signals of finite duration, wherein the goal is to recover the integrated areas of the input signals. Particular applications include processing step-like signals generated by detector systems in response to absorbed radiation or particles and, more particularly, to digitally processing such step-like signals in high resolution, high rate gamma ray (γ-ray) spectrometers with resistive feedback preamplifiers connected to large volume germanium detectors. Superconducting bolometers can be similarly treated. The method comprises attaching a set of one or more filters to the device's (e.g., preamplifier's) output, capturing a correlated multiple output sample from the filter set in response to a detected event, and forming a weighted sum of the sample values to accurately recover the total area (e.g., charge) of the detected event.

62 Claims, 6 Drawing Sheets

OTHER PUBLICATIONS

Goulding et al., "Ballistic Deficit Correction in Semiconductor Detector Spectrometers", I.E.E.E. Trans. Nuclear Science, vol. 35, No. 1, (1988) 119–124.

Knoll, Glenn F., "Radiation Detection and Measurement, 2nd Ed." (J. Wiley, New York, 1989).

Radeka, V., "Trapezoidal Filtering of Signals from Large Gemanium Detectors at High Rates", I.E.E.E. Trans. Nuclear Science, vol. NS–19 (1982) 412–428.

Raudorf et al., "Pulse Shape and Risetime Distribution Calculations for HPGe Coaxial Detectors", I.E.E.E. Trans. Nuclear Science, vol, NS–29, No. 1 (1982) 764–768.

Stahle et al., "Design and performance of the Astro–E/XRF microcalorimeter array and anti–coincidence detector", in Proc. of the SPIE No. 3765, "EUV, X–ray and Gamma–ray Instrumentation for Astronomy X"(Denver, CO, Jul. 21–23, 1999), in press.

Takahashi et al., "A Multiparametric Waveform Analysis of GE Detector Signal Based on Fast ADC Digitizing Technique", I.E.E.E. Trans. Nuclear Science, vol. 41, No. 4, (1994) 1246–1249.

White, G., "Pulse Processing for Gamma Ray Spectrometry: a Novel Method and its Implementation", I.E.E.E. Trans. Nuclear Science, vol. 35, No. 1, (1988) 125–130.

* cited by examiner

US 6,587,814 B1

METHOD AND APPARATUS FOR IMPROVING RESOLUTION IN SPECTROMETERS PROCESSING OUTPUT STEPS FROM NON-IDEAL SIGNAL SOURCES

CROSS-REFERENCE TO RELATED APPLICATIONS

This application claims priority from provisional application No. 60/151,020 filed Aug. 27, 1999, the disclosure of which is incorporated by reference in its entirety for all purposes.

STATEMENT AS TO RIGHTS TO INVENTIONS MADE UNDER FEDERALLY SPONSORED RESEARCH AND DEVELOPMENT

The U.S. Government has rights in this invention pursuant to Contract No. DE-FG03-97ER82510 awarded by the Department of Energy.

BACKGROUND OF THE INVENTION

The present invention relates generally to signal processing systems, and more particularly to processing the step-like output signals generated by non-ideal, nominally single-pole ("N-1P") devices responding to possibly time-varying, pulse-like input signals of finite duration, wherein the goal is to recover the integrated areas of the input signals.

The specific embodiments described relate to processing step-like signals generated by detector systems in response to absorbed radiation or particles and, more particularly, to digitally processing such step-like signals in high resolution, high rate gamma ray (γ-ray) spectrometers with resistive feedback preamplifiers connected to large volume germanium detectors. The application of measuring the step-like output signals from γ-ray detector preamplifiers to measure the γ-rays' energies is just a specific example, and is described because this was the area in which the method was first developed.

The techniques that we have developed solve this problem generally, and therefore should not be construed as being limited to this specific application. Any detection system, for example, that produces output current signals that are integrated by charge sensitive preamplifiers could be treated by these techniques, whether the detected quantities are light pulses, x-rays, nuclear particles, chemical reactions, or otherwise. The techniques, in fact, is not limited to "detector systems" per se, but are, in fact, general purpose signal processing techniques which may be broadly applied, once understood. The outputs from superconducting bolometers, for example, produce step-like signals that are readily treated by the invention. The field of gamma spectroscopy, where 0.1% or less makes the difference between a bad and a good detector, however, provides particularly stringent tests of our techniques.

The term "step-like signal" also requires some discussion. The output of an ideal single-pole ("1P") device to an ideal impulse (delta) function input, is an infinitely fast rise time followed by an exponential decay whose time constant $\tau_d$ is characteristic of the pole. Viewed on a time scale short compared to $\tau_d$, this output will look like a pure step, while, when viewed on a time scale long compared to $\tau_d$, it will look like a pulse. A real 1P device output, however, will have a finite risetime, $\tau_r$, whose duration will be determined both by the nature of the device and, particularly, by the duration of its real input signal. Provided that $\tau_r$ is significantly shorter than $\tau_d$, a real 1P device output signal, viewed on a time scale comparable to $\tau_d$, will then show a risetime region, whose shape may be difficult to describe mathematically, followed, after a period comparable to $\tau_r$, by an exponential decay with time constant $\tau_d$. The output of a N-1P device will be similar, with additional distortions. We will refer to such signals, viewed on this time scale, as "step-like".

Gamma-ray (γ-ray) Detection Requirements

The detection and measurement of γ-ray energies is a well-established discipline whose primary goal is to accurately determine both the number and energies of γ-rays emitted from some target source. The requirements of good energy resolution and high count rate capability usually conflict, however, since count rates are enhanced by increasing detector volume, which increases output signal distortion and so degrades energy resolution. High count rates also degrade energy resolution directly due to practical problems in preamplifier design.

Description of the Problems

The field of γ-ray detection is highly developed. A fairly comprehensive introduction to the state of the art may be found in the volume "Radiation Detection and Measurement, 2nd Ed." by Glenn F. Knoll [KNOLL-1989]. Below we note only the issues relevant to the present invention. In the first section, we discuss how pole/zero cancellation errors introduce a second pole, spoiling the preamplifier's single pole response. In the second section, we examine how the finite input signal duration, in this case due to charge collection, distorts the preamplifier's output from the ideal.

Pole/zero Cancellation Errors

FIG. 1A shows a typical solid state γ-ray spectrometer comprising a semiconductor detector diode 7 biased by a voltage supply 8 and connected to a preamplifier 10 comprising an amplifier 13 with a feedback capacitor C 15 and resistor R 17. As drawn, preamplifier 10 is a single pole circuit whose response to an impulse (delta function) input is $A \exp(-t/\tau_2)$, where $\tau_2 = RC$ and A is the area under the impulse. Because $\tau_2$ is typically of order 1 ms, which is too long for the following circuits, a pole/zero (P/Z) network 20 cancels the pole at $1/\tau_2$ and replaces it with a pole at $1/\tau_1$, where $\tau_1$ typically is 50 μs. Gain stage 22 then amplifies and buffers the preamplifier's output signal for shaping amplifier 23 which feeds multichannel analyzer (MCA) 24.

If the time duration of the current pulse arising from the charge deposited in detector 7 by a γ-ray absorption is very short compared to $\tau_1$, the output of stage 22 will be an exponentially decaying step whose amplitude is the pulse integral and proportional to the deposited charge. γ-ray spectrometers are therefore designed to measure these step amplitudes to measure the charge deposited by the absorbed γ-ray. Other forms of radiation, including neutrons, alpha and beta particles, and x-rays behave similarly and their energies are measured the same way.

Commonly, however, both the input's finite duration and the pole-zero circuit's imperfections distort the preamplifier's response, destroying the proportionality between the output step's amplitude and the deposited charge and so degrading the system's energy resolution. Imperfections in P/Z network 20 arise from difficulties in precisely canceling the $\tau_2$ component, leaving a small residual fraction, of order 1–2%, in the output signal. FIG. 1B shows a 5% residual $\tau_2$ component for ease of viewing: an exponential decay signal 25 with time constant $\tau_2$, input to the P/Z network 20, produces either output signal 27 or 29, depending upon whether the residual $\tau_2$ term is positive or negative.

These $\tau_2$ residuals are particularly bothersome at high counting rates, where each signal step rides upon a $\tau_2$ background from all preceding steps. As these arrive randomly, the resulting baseline bias also fluctuates randomly in time, which the spectroscopy amplifier's baseline restoration circuit cannot track well. These terms, which may only be a few tenths of 1%, become a significant resolution degradation at 1 MeV where 0.05% energy resolution is desired.

Signal Risetime Fluctuations and Ballistic Deficit

FIG. 2 shows a preamplifier 10 front end with a cross sectional view of the detector 7 of FIG. 1, for the common coaxial geometry, The dashed lines show electric field line within the detector body 30, which vary considerably with local geometry. Two factors cause charge collection time variations within the detector and thus risetime variations in the preamplifier's 10 signal output: 1) the difference between carrier velocities; and 2) the existence of different path lengths within the detector. RAUDORPH-1982 describes these issues. These risetime variations produce ballistic deficit by two paths, one direct, one indirect. The direct effect is well understood, per GOULDING-1988: the output filter's response varies with the time dependent shape of the charge arrival, being the convolution of the two. A trapezoidal filter greatly reduces this effect in the absence of exponential decay.

The indirect effect source of ballistic deficit is due to fluctuations in charge loss through the feedback resistor with differing risetime, as seen in FIG. 3A with two risetimes, 40 and 42, where FIG. 3B enlarges their peak regions. The slower risetime signal loses less charge and thus is larger once charge collection is complete. Even filters which ignore the charge collection region are still sensitive to this lost charge effect, and relatively small errors of this size can substantially degrade resolution. For a trapezoidal filter, the collection time difference shown FIG. 3B produces a 0.2% amplitude difference (2,000 eV at 1 MeV) which will degrade ideal 1.7 keV resolution to 2.6 keV. Ballistic deficit errors must therefore be reduced to less than 0.05% to obtain ideal spectrometer resolutions at 1 MeV.

Charge Trapping Losses

Charge trapping also produces errors in γ-ray energy measurements since trapped charges are lost to the measurement. The present invention does not seek to address this problem.

Generalizations

It is important to note that the pole-zero cancellation errors described above do not arise from the preamplifier's use in γ-ray spectroscopy, but are a generic problem in low noise, charge sensitive preamplifiers. Similarly, while the described risetime fluctuations described above were attributed to the geometry and construction of large volume Ge detectors, it is clear that such problems fundamentally arise from interactions between the finite charge collection time and the electrical characteristics of the preamplifier and not from the physics of the collection processes. Geometric heat flow variations in the photon absorbing mass produce similar effects in the superconducting bolometers mentioned earlier. Risetime issues are therefore a potentially general problem as well, and may need to be corrected for in other, non-γ-ray, detectors whenever the highest measurement accuracies are required. The methods we describe offer just that capability. Further, the terminology "single-pole" or "multiple-pole" comes from the LaPlace Transform treatment of differential equations describing time variant phenomena. Any device which shows "single pole" behavior, for example, will display exponential time decay in response to an impulse input and, therefore, may be, for example, mechanical, thermal, chemical, or magnetic in nature in addition to the electronic case presented here. Our method can be directly applied to these devices as well, as will be apparent from the teachings herein.

Existing Correction Schemes

The prior art deals with pole/zero errors in two ways: first, by canceling $\tau_2$ as accurately as possible; and, second, with baseline restoration schemes which try to track the shaping amplifier's "no signal" output as closely as possible, an approach which degrades as rates becomes high. We have not found any approaches which measure and/or correct for the effect directly.

Over the years, various heuristic schemes have been developed which attempt to compensate for ballistic deficit. RADEKA-1982 introduced trapezoidal filtering and developed a time-variant implementation, using a gated filter following a semi-Gaussian shaper, that provided significant resolution improvements. WHITE-1988 proposed a different gated integration approach using a series switch to excise the charge collection region out of the preamplifier signal entirely. The final circuit was complex and had enhanced deadtime problems. GOULDING-1988, RAUDORF-1982, and SIMPSON-1990 disclose schemes that depend on directly measuring the signal's risetime $t_r$ and correcting the energy filter output by a term like $t_r^n$. These approaches are complex to implement and require precise expert adjustments to operate. The underlying assumptions are not particularly valid and improvements in energy resolution have been modest in practice.

HINSHAW-1991 and KUMAZAWA-1998 describe attempts to correct for ballistic deficit by capturing peak amplitudes from two filters which respond to the ballistic deficit differently, one an energy measuring filter and one a differentiating (or bipolar shaping) filter. Typically a significant fraction of their difference in peak heights is added to the energy filter's peak to correct it.

Related Art

There is some related art wherein the details of the shapes of the preamplifier output signals are sampled digitally and used either to distinguish between different types of particles absorbed in the detector (e.g., MILLER-1994) or to distinguish between single and multiple interaction events in large germanium detectors. See, for example, TAKAHASHI-1994 and AALSETH-1998.

WARBURTON-1997, WARBURTON-1998, and WARBURTON-1999 describe methods for implementing digital filtering and x-ray spectroscopy. While they do not address the issues under consideration, some of their filtering techniques will be employed in the present invention and are referenced in the specification.

SUMMARY OF THE INVENTION

The present invention provides techniques for measuring a step-like output signal from a nominally single-pole (N-1P) device in response to a pulse-like input signal to determine the integrated area of said input signal. The invention addresses the possibility that the device deviates from ideality due to the presence of additional poles, zeros and/or a DC offset and that the input pulses may have finite time durations and variable amplitudes. In a specific example, the measurement determines collected detector charges from step-like preamplifier output signals in the presence of both risetime fluctuations and imprecise pole/zero cancellations.

In brief, the present invention contemplates processing the N-1P device's (e.g., preamplifier's) output signal using a set of one or more shaping filters. Where plural filters are used, they typically have different time constants. A set of samples of the outputs of this filter set is captured in such a manner that the multiple sample values bear prescribed time relationships to one other. We refer to this set of sample values as a correlated multiple output sample (or "cMOS" for short). The relationships among the individual sample values may be determined by the times of their capture, by delay elements inserted in the signal paths, or some combination of the two. Further, the different individual sample values can be obtained from associated different filters, or plural sample values can be obtained from the same filter, but captured at different times or with different delays. The term cMOS is intended to cover these multiple possibilities and is discussed further in § 5.1 below.

The input pulse's integrated area is determined by capturing a cMOS in response to detecting a step-like signal (sometimes called an event). A weighted sum of the individual sample values in the cMOS (sometimes referred to as cMOS values) is then formed as a measure of the input pulse's integrated area (e.g., total charge). The weighting factors can be computed directly from information about the N-1P device's decay constants, the filter set, and the prescribed time intervals in the cMOS.

While embodiments of the invention use triangular and trapezoidal filters, the invention does not require specific filter shapes. Further, the invention does not require that the filter's capture times be precisely located relative to the step-like signal's leading edge. Rather, the method derives its accuracy from repeatably reproducing the set of prescribed time relationships between the sample values in the cMOS. The underlying capture method is therefore time-based rather than amplitude-based, which differentiates the invention from prior art methods which capture filter samples based on their maximum amplitudes.

While the preferred implementation uses digital signal processing, implementations using solely analog processing or hybrid approaches are also feasible. Embodiments of the invention require neither a measurement of the step-like signal's risetime nor more precise information about its arrival time than is found by the pileup inspection circuits of commonly available commercial shaping amplifiers.

When using a single cMOS, however, the measurement's noise is increased by the number N of additional filter samples required to compensate for the N-1P device's non-ideal terms. For those cases where this increased noise is significant, we also show how N may be reduced by creating a parameterized model of the non-ideal terms; making baseline measurements to determine the parameters; and then using them to correct area (e.g., charge) measurements made using simpler sets of filters which have less noise. In some implementations, these baseline measurements are cMOS values captured at times when the filters are not processing the step-like signals. In the detector-preamplifier case described in detail, the resultant implementation achieves the low electronic noise levels of conventional trapezoidal filters while also eliminating resolution loss due to both ballistic deficit and high count rates.

A further understanding of the nature and advantages of the present invention may be realized by reference to the remaining portions of the specification and the drawings.

DESCRIPTION OF SPECIFIC EMBODIMENTS

1. Introduction

Figure 1A:
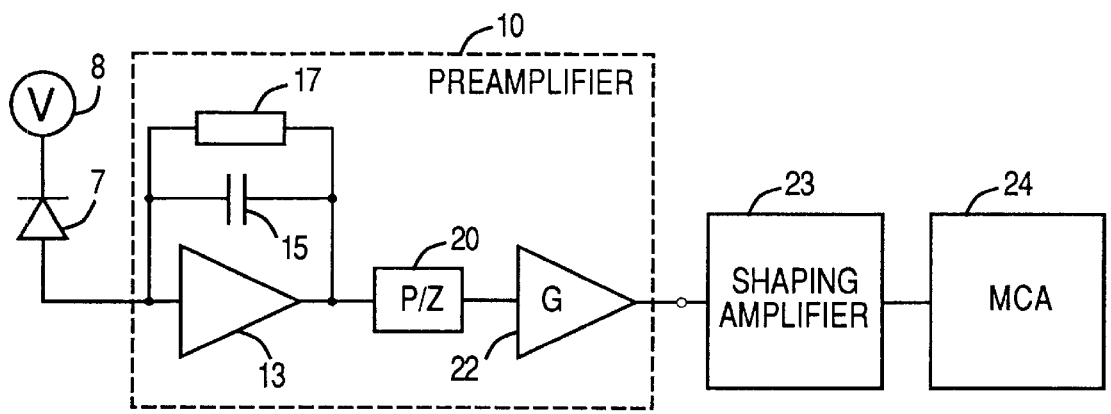
FIG. 1A shows a schematic of a semiconductor γ-ray detector front end, including a resistive feedback integrator, pole/zero network and output gain stage.
Figure 1B:
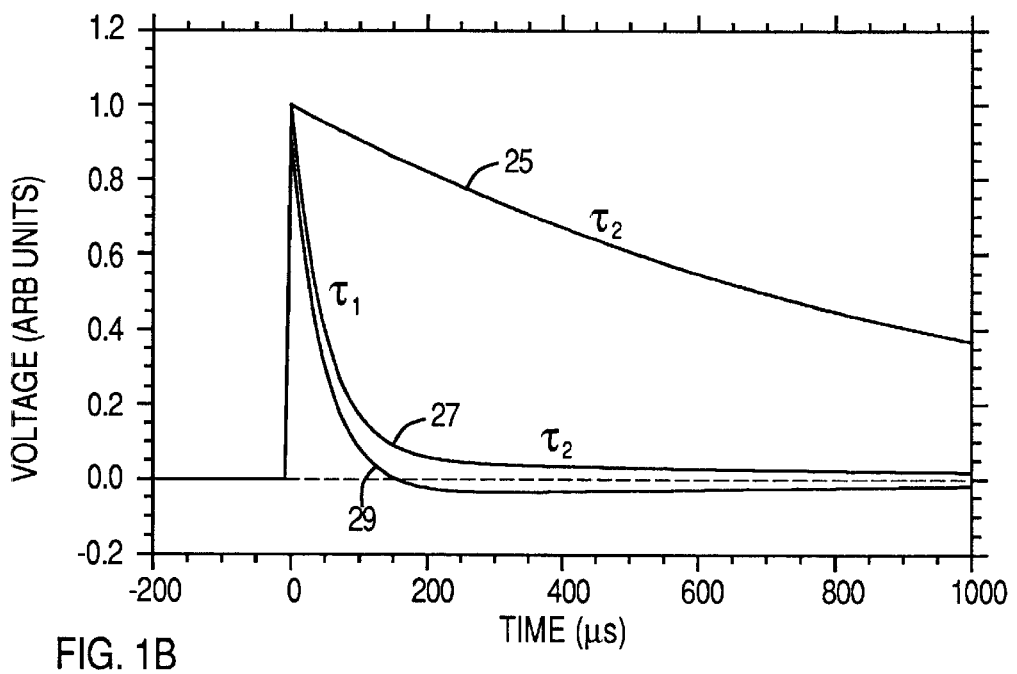
FIG. 1B shows voltages generated by the preamplifier portion of the circuit in FIG. 1A when the pole/zero circuit is not ideally adjusted.
Figure 2:
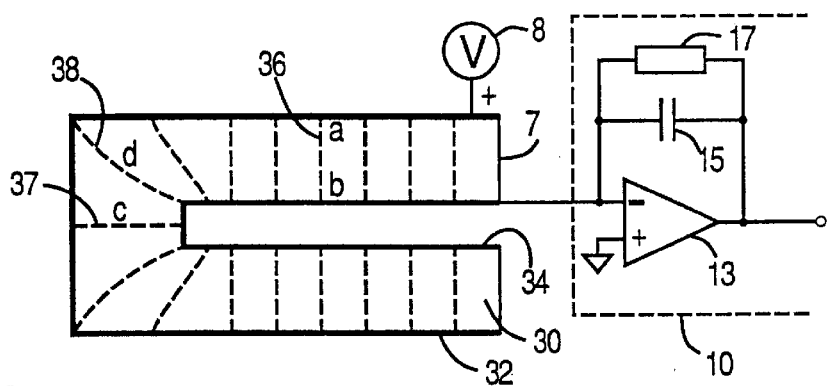
FIG. 2 expands the detector structure of FIG. 1A to demonstrate the geometric and other factors which contribute to signal risetime variations.
Figure 3A:
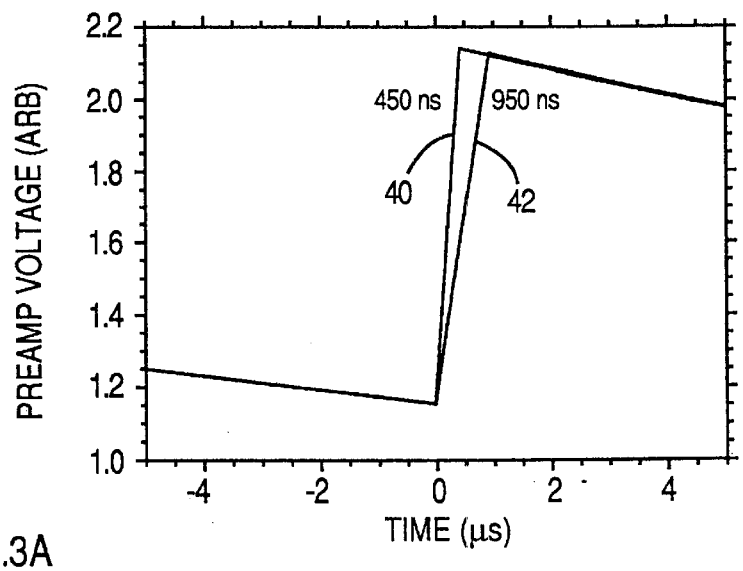
FIG. 3A shows the variation in risetime between pure electron and pure hole collection for a simple collection path in the detector structure of FIG. 2.
Figure 3B:
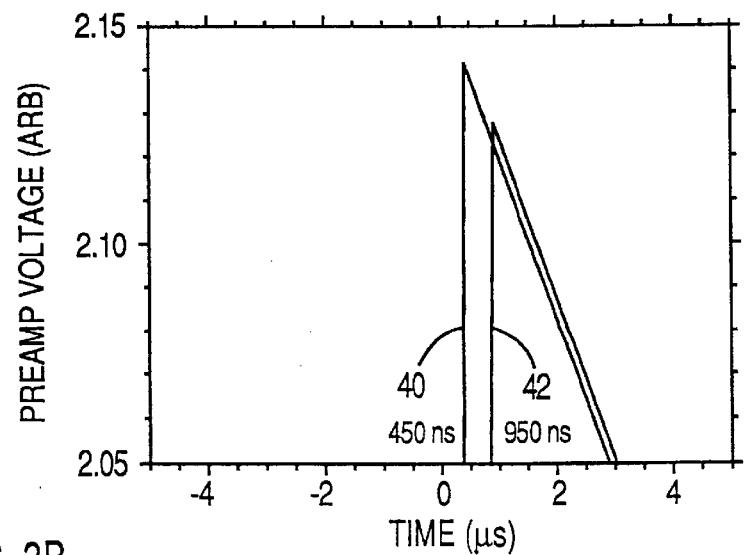
FIG. 3B shows an expanded view of the signal peaks in FIG. 3A.

The invention has three basic steps: applying a set of filters to the preamplifier output; capturing a correlated multiple output sample ("cMOS") from the filter set in response to a detected event; and forming a weighted sum of these sample values to accurately recover the energy of the detected event. The cMOS is a set of samples bearing a prescribed set of time relationships between one another. The appropriate time relationships are achieved by setting the times of capture, inserting delays into the signal paths, or a combination thereof, and are independent of the specific risetime shape of any particular event. Our overall goal, therefore, is to describe how to select an appropriate set of filters; explain what it means to capture a cMOS and how to achieve it; and show how to compute the weighting functions.

The theory underlying the invention method is based on modeling the preamplifier's (or N-1P device's) step-like output response (the "output") to the input charge (or impulse: the "input") generated by the event as the sum of a small number of analytical functions which are represented by the same number of amplitudes. In a specific embodiment, five amplitudes are used to describe: the $\tau_1$ and $\tau_2$ exponential components prior to the step-like signal, the ideal amplitude of the step itself, an error term due to the ballistic deficit, and a DC level. We first reduce the number of amplitudes to four by making differential filter measurements which are DC level insensitive. To find these four amplitudes, we make four independent measurements (from three filters) in the step's vicinity, express each measurement as a linear combination of the four amplitudes, and solve the resultant set of four linear equations to recover the ideal step amplitude, which is proportional to the input charge (or impulse area). Obtaining a set of equations which is well conditioned and insensitive to preamplifier noise, ballistic deficit, and $\tau_2$ amplitude is then primarily a matter of selecting an appropriate set of filters and time correlated capture points, which then define the cMOS.

Step amplitudes obtained using the four-filter measurement method have almost a factor of 3 higher electronic noise than simple trapezoidal filters. In cases where this is important, we show how simpler filters can be corrected for the $\tau_2$ and DC components by developing a parameterized model of these terms and making one or more baseline measurements to determine their values. When multiple measurements are made, the parameters must be compensated for their evolution in time, creating a time-compensated model.

The description below is organized as follows In §2, using a static, captured step-like signal, we locate several filters in the vicinity of its leading edge and mathematically describe their outputs in terms of the base amplitudes. In §3, we use these results to set up and solve the set of linear equations to obtain the input charge. This solution has the form of a weighted sum of the filter values, showing the genesis of the weighting coefficients. In §4, we evaluate the method for two filter sets which compensate simultaneously for inexact pole/zero cancellation and ballistic deficit. In §5, we introduce the concept of the cMOS to show how to implement the invention in real time processing situations. In §6, we will describe various circuits which implement this method: a purely digital pair, a purely analog circuit and a hybrid analog-digital circuit. In §7, we analyze our method's electronic noise. Finally, in §8, we show how a simpler, three filter measurement can be used to achieve similar accuracy with lower noise, provided time recorded baseline measurements are made to correct for the $\tau_2$ and DC preamplifier components

2. Mathematical Description of Generalized Filter Outputs

2.1. Decay Components of the Step-like Signal

Figure 4:
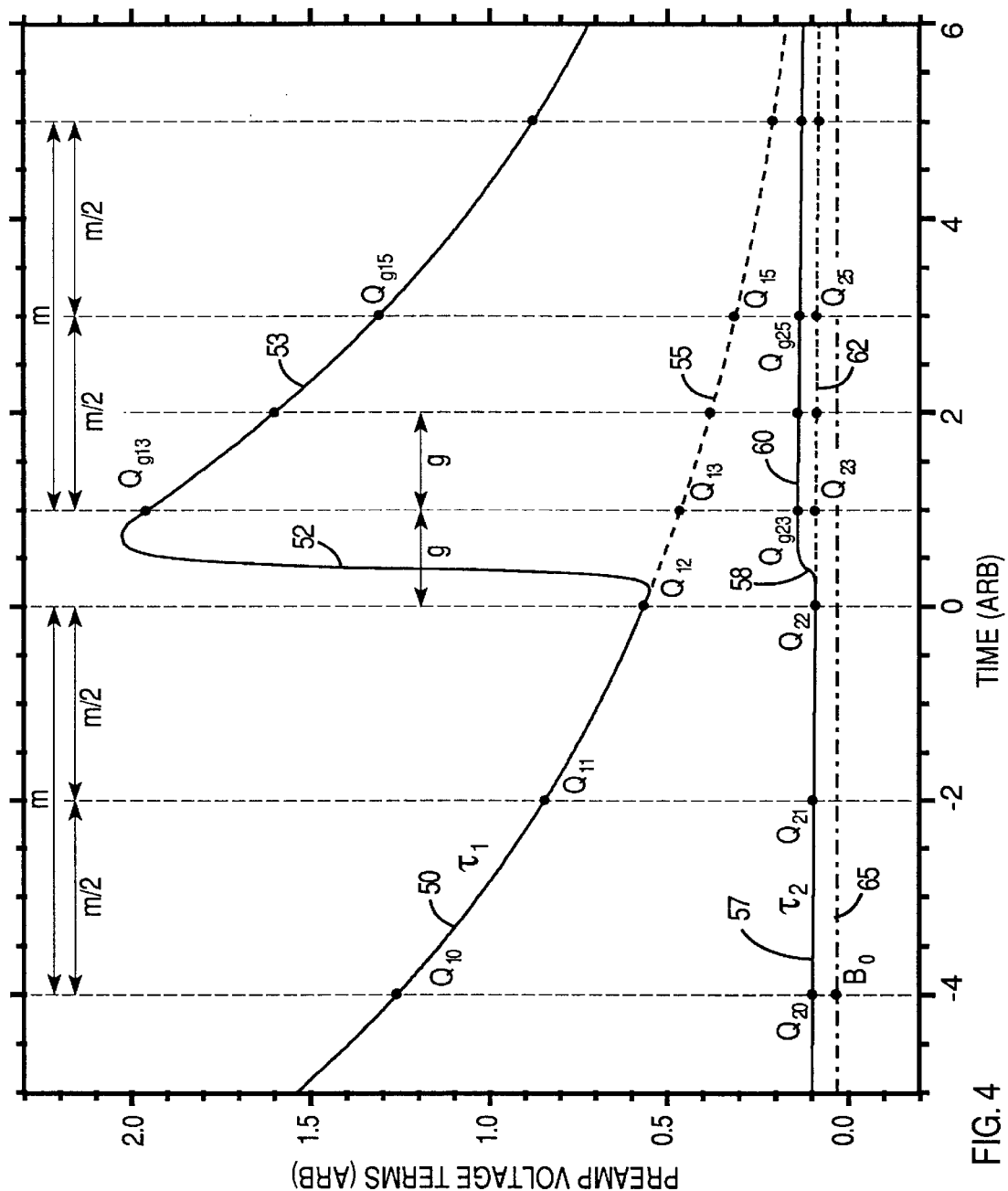
FIG. 4 shows a step-like feature in a general preamplifier output, broken into its component signals, and establishes a nomenclature system for describing these signals mathematically.

FIG. 4 shows a typical preamplifier step-like output signal as it might look if it were digitized by an analog to digital converter (ADC) and saved in a computer memory. The shown time scale is arbitrary, with zero set a little before the onset of charge collection for convenience. To simplify the image, only a few members of the set of discrete values have been identified explicitly: subscripted capital Q's denote values at specific instants since the signal really represents the charge integrated on feedback capacitor 15 by amplifier 13. The $\tau_1$ component has three regions: an exponential decay region 50 prior to the step (i.e., times less than 0), a charge collection region 52, and an exponential decay region 53 following the step (i.e., times greater than 1). The curve 55, showing how curve 50 would have continued to decay had the step not arrived, represents the continued time decay of all previous steps, that is, the preamplifier's first pole residual response to those previous steps. The signal's $\tau_2$ component has the equivalent four regions 57, 58, 60, and 62. Finally, there is the preamplifier's DC offset value $B_0$ 65, which is constant. The $\tau_1$ and $\tau_2$ charges injected by the γ-ray pulse decay independently, since the preamplifier is a linear device. The total collected charge $Q_{gT}$ generating this event thus divides into $Q_{1gT}=(1-\beta)Q_{gT}$ for $\tau_1$ and $Q_{2gT}=\beta Q_{gT}$ for $\tau_2$, β being the division ratio.

It is important to note that, in the following, we will be describing a signal processing technique which relies on the mathematical form of the signals and not on their physical source. While we develop the method in the context of preamplifier signals from γ-ray detector preamplifiers, the method itself can be usefully applied to any signals which have the appropriate form. Similar outputs would generally be obtained from nominally single pole devices (N-1P devices) in response to impulse inputs of extended duration and variable amplitude. In the present case these signals result from a single pole electronic circuit responding to an input pulse from a detector, in other cases the detector itself may produce signals of the appropriate form. The temperature response of a superconducting bolometer, for example, shows this behavior [STAHLE-1999] and could be treated by the method.

2.2. Running-sum Filter Output

If r values are sampled at uniform intervals $\Delta t$ from an exponential decay with time constant $\tau_j$, then the $i^{th}$ value $Q_{j,i}$ is given by:

$$Q_{j,i}=Q_{j,0}\exp(-i\Delta t/\tau_j)=Q_{j,0}b_j^i, \text{ for } (0 \leq i \leq r-1) \quad (1)$$

where $b_j=\exp(-\Delta t/\tau_j)$ is the decay per $\Delta t$. Therefore, a $k^{th}$ digital filter, defined by weighting constants $\{w_{i,k}, 1 \leq i \leq r-1\}$, acting on the values in Eqn. 1 gives:

$$\sigma_{jk,r} = \sum_{i=0}^{r-1} Q_{i,j} w_{i,k} = Q_{j,0} \sum_{i=0}^{r-1} b_j^i w_{i,k} \equiv Q_{j,0} A^*_{jk,r}, \quad (2)$$

where the * marks this as a general filter result. This shows that the filter output is linear in the amplitude $Q_{j,0}$, multiplied by $A^*_{j,k,r}$, which is a constant for a particular filter and decay constant $\tau_1$. For a simple running-sum filter (see WARBURTON-1999), w equals unity, so $$A_{jr} = \sum_{i=0}^{r-1} b_j^i = \frac{1-b_j^r}{1-b_j} \equiv r_j(1-b_j^r). \quad (3)$$

Eqn. 3 also defines the division factor $r_j$, which is equal to the sum to infinity.

2.3. General Trapezoidal Filter Output with Risetime in its Gap

Next, consider a running-sum $\sigma_{\Sigma+}$ of m samples starting at time 1 over the signal in FIG. 4. Decomposing the signal into 5 components with amplitudes $\{Q_{g13}, Q_{13}, Q_{g23}, Q_{23},$ and $B_0\}$, Eqns. 2 and 3 give:

$$\sigma_{\Sigma+}=Q_{g13}A_{1,m}+Q_{13}A_{1,m}+Q_{g23}A_{2,m}+Q_{23}A_{2,m}+mB_0, \quad (4)$$

where the index j in $A_{j,m}$ equals 1 or 2 for $\tau_1$ and $\tau_2$. The equivalent sum $\sigma_{\Sigma-}$, starting at time −4, which only sees amplitudes $\{Q_{13}, Q_{23},$ and $B_0\}$ is then:

$$\sigma_{\Sigma-}=Q_{10}A_{1,m}+Q_{20}A_{2,m}+mB_0, \quad (5)$$

The difference ($\sigma_{\Sigma+}-\sigma_{\Sigma-}$) is a trapezoidal filter $\sigma_\Sigma$ of risetime m and gap g. Since $Q_{10}=b_1^{-m-g}Q_{13}$ and $Q_{20}=b_2^{-m-g}Q_{23}$:

$$\sigma_\Sigma=\sigma_{\Sigma+}-\sigma_{\Sigma-}=Q_{g13}A_{1,m}+Q_{13}\alpha(1,m,-m-g)+Q_{g23}A_{2,m}+Q_{23}\alpha(2,m,-m-g), \quad (6)$$

where $\alpha(j,r,s)=A_{j,r}(1-b_j^s)$ and the DC components cancel. In Eqn. 6, we stress that $Q_{13}$ represents, at time instant 3, the preamplifier's dominant pole ($\tau_1$) response to all preceding step-like signal events; $Q_{23}$ similarly represents the secondary pole ($\tau_2$); while $Q_{g13}$ and $Q_{g23}$ are their amplitude responses to the present event. Eqn. 6 takes its simple form because the signal rise occurs entirely within the filter gap region g, so only decaying exponential terms are measured outside. Thus $\sigma_\Sigma$ is relatively insensitive to the precise location of the step within the gap region because its weighting constants are negligible (zero, in fact) there.

2.4. Triangular Filter Over the Charge Collection Region

To explicitly probe the step's risetime region, we will use a triangular filter (gap=0) $\sigma_g = (\sigma_{g+} - \sigma_{g-})$ of risetime g, whose subtractive leg $\sigma_{g-}$ sits precisely within the gap of $\sigma_\Sigma$. (This relationship will also be easy to achieve when we implement a digital real time system.) We will show that the precise location of the step within the gap is not important. Then, as above:

$$\sigma_g = \sigma_{g+} - \sigma_{g-} \quad (7)$$
$$= Q_{g13}A_{1,g} + Q_{13}\alpha(1, g, -g) + Q_{g23}A_{2,g} + Q_{23}\alpha(2, g, -g) - \sum_{i=0}^{g-1} q_{1g,i} - \sum_{i=0}^{g-1} q_{2g,i},$$

where the $q_{jg,i}$ are the sampled charge values at each interval in the subtracted running-sum region, each comprising the new charge increment collected in that interval plus the exponentially decaying remnants of the charges collected in the previous intervals.

Since each charge increment decays to zero independently, while their sum equals the total collected charge, we can write $$r_1 Q_{1gT} = \sum_{i=0}^{\infty} q_{1g,i} \quad \text{and} \quad (8a)$$

$$r_2 Q_{2gT} = \sum_{i=0}^{\infty} q_{2g,i}. \quad (8b)$$

Splitting the infinite summation, however, also gives:

$$r_1 Q_{1gT} = r_1 Q_{gT}(1-\beta) = \sum_{i=0}^{g-1} q_{1g,i} + r_1 Q_{g13}, \quad (9)$$

so that $$\sum_{i=0}^{g-1} q_{1g,i} = r_1 \{Q_{gT}(1-\beta) - Q_{g13}\} \equiv r_1 Q_c. \quad (10)$$

The correction charge $Q_c$ defined in Eqn. 10 is the difference between the total $\tau_1$ collected charge and the amount remaining at the end of gap g. $Q_c$ will typically be of order 2% of $Q_{gT}$. As a small correction term, $Q_c$ will be relatively uncorrelated to $Q_{g13}$, so the set of linear equations we solve for $Q_{g13}$ and $Q_c$ be well conditioned under inversion.

Similarly, for the $\tau_2$ component:

$$\sum_{i=0}^{g-1} q_{2g,i} = r_2 \{Q_{gT}\beta - Q_{g23}\} \equiv r_2 Q_{c2}, \quad (11)$$

where $Q_{c2}$ will be smaller than $Q_c$ by approximately the ratio $\tau_1/\tau_2$. Eqns. 10 and 11 allow us to express $\sigma_g$ entirely in terms of $Q_{gT}$, the total charge, and values from outside of the charge collection region, where the signals behave strictly as decaying exponentials. Equivalent integral expressions may similarly be derived in the continuous signal case or for filters with other weighting constants.

2.5. Eliminating $Q_{c2}$

When the gap region is much smaller than both $\tau_1$ and $\tau_2$, $Q_{c2}$ becomes proportional to $Q_c$ to a high degree of accuracy.

This may be seen by defining $Q_{gi}$ as the total γ-ray charge collected at time interval i in the collection region. Since each $Q_{gi}$ decays independently, we can write for the two components:

$$\sum_{i=0}^{g-1} (1-\beta) Q_{gi} b_1^{g-i} = Q_{g13} \quad \text{and} \quad (12a)$$

$$\sum_{i=0}^{g-1} \beta Q_{gi} b_2^{g-i} = Q_{g23}, \quad (12b)$$

while, by definition, $$\sum_{i=0}^{g-1} (1-\beta) Q_{gi} = (1-\beta) \sum_{i=0}^{g-1} Q_{gi} = (1-\beta) Q_{gT} \quad \text{and} \quad (13a)$$

$$\sum_{i=0}^{g-1} \beta Q_{gi} = \beta \sum_{i=0}^{g-1} Q_{gi} = \beta Q_{gT}, \quad (13b)$$

Thus, for $Q_c$:

$$Q_c = (1-\beta) Q_{gT} - Q_{g13} = (1-\beta) \sum_{i=0}^{g-1} Q_{gi}(1 - b_1^{g-i}). \quad (14)$$

Expanding $b_1^{g-i}$ to good accuracy as $(1-(g-i)\Delta t/\tau_1)$ gives $(1-b_1^{g-i})$ equal to $(g-i)\Delta t/\tau_1$ so:

$$Q_c = (1-\beta) \frac{\Delta t}{\tau_1} \sum_{i=0}^{g-1} Q_{gi}(g-i). \quad (15)$$

Similarly:

$$Q_{c2} = \beta \frac{\Delta t}{\tau_2} \sum_{i=0}^{g-1} Q_{gi}(g-i), \quad (16)$$

where $\rho_2$ is equal to $\Delta t/\tau_2$. Comparing Eqns. 15 and 16:

$$Q_{c2} = \frac{\beta \tau_1}{(1-\beta) \tau_2} Q_c \cong F Q_c. \quad (17)$$

$Q_{c2}$ is therefore quite small, being about 0.1% of $Q_c$ or 0.002% of $Q_{gT}$. We can therefore express any of our filters in terms of the four quantities $Q_{gT}$, $Q_c$, $Q_{g13}$ and $Q_{g23}$ using:

$$\sum_{i=0}^{g-1} q_{1g,i} = r_1 Q_c \quad (18a)$$

$$Q_{g13} = (1-\beta) Q_{gT} - Q_c \quad (18b)$$

$$\sum_{i=0}^{g-1} q_{2g,i} = r_2 F Q_c \quad (18c)$$

$$Q_{g23} = \beta Q_{gT} - F Q_c. \quad (18d)$$

3. Solving for Collected Charge $Q_{gT}$ from the Captured Waveform

3.1. Filter Expressions in Terms of the Base Amplitudes

§2.5 shows how all difference filters in the vicinity of the step's leading edge can be expressed as linear equations in the four amplitudes $Q_{gT}$, $Q_c$, $Q_{g13}$ and $Q_{g23}$ (non-difference filters will also require $B_0$). Therefore we must make four (or five) independent filter measurements to solve for $Q_{gT}$. While a wide variety of filters could be used, certain sets will be better conditioned than others and will also require less measurement precision to accommodate step risetime variations. Research and experimentation have shown the following set to function well: 1) the trapezoidal "energy" filter of risetime m from Eqn. 6; 2) the triangular "risetime probe" filter of Eqn. 7; and, 3) a pair of triangular "$\tau_1$ and $\tau_2$ background" filters of risetime m/2, situated at times −4 and +1 in FIG. 4, respectively. It is important to notice that, in this selection, only the risetime probe filter processes the step's risetime, which lies in the energy filter's gap and is entirely outside the range of the two other triangular filters. This placement, where only the risetime probe filter has non-negligible weighting constants in the risetime region, assures that their outputs, and hence $Q_{gT}$ estimate, will be insensitive to the precise location of the signal step within the gap, which, in real time implementations, will remove any need for great timing precision. That the filters share some common starting and stopping points is primarily a matter of mathematical and implementational convenience, but is not fundamental to the technique.

Substituting Eqns. 18 into Eqns. 4 through 7 gives four linear equations for $\sigma_{\Sigma+}$, $\sigma_{\Sigma-}$, $\sigma_\Sigma$, and $\sigma_g$ in terms of $Q_{gT}$, $Q_c$, $Q_{13}$ and $Q_{23}$:

$$\sigma_{\Sigma+} = Q_{gT}[(1-\beta)A_{1,m} + \beta A_{2,m}] - \quad (19a)$$
$$Q_c[A_{1,m} + FA_{2,m}] + Q_{13}[A_{1,m}] + Q_{23}[A_{2,m}] + mB_0,$$

$$\sigma_{\Sigma-} = Q_{gT}[0] - Q_c[0] + Q_{13}[b_1^{-m-g}A_{1,m}] + Q_{23}[b_2^{-m-g}A_{2,m}] + mB_0, \quad (19b)$$

$$\sigma_\Sigma = Q_{gT}[(1-\beta)A_{1,m} + \beta A_{2,m}] - Q_c[A_{1,m} + FA_{2,m}] + \quad (19c)$$
$$Q_{13}[\alpha(1, m, -m-g)] + Q_{23}[\alpha(2, m, -m-g)],$$

$$\frac{\sigma_g}{r_1} = Q_{gT}\left[\frac{(1-\beta)A_{1,g} + \beta A_{2,g}}{r_1}\right] - Q_c\left[(2-b_1^g) + \frac{r_2}{r_1}F(2-b_2^g)\right] + \quad (19d)$$
$$Q_{13}\left[\frac{\alpha(1, g, -g)}{r_1}\right] + Q_{23}\left[\frac{\alpha(2, g, -g)}{r_1}\right];$$

We divided $\sigma_g$ by $r_1$ so that the coefficient of $Q_c$ will approximately equal unity for inversion stability.

Using the same methods for the outputs of three filters of length m/2 (two triangular filters $\sigma_{43}$ and $\sigma_{21}$ whose running-sum first points are: $\sigma_{43}$=[time +3: time +1] and $\sigma_{21}$=[time −2: time −4] and a trapezoidal filter $\sigma_{32}$=[time +2: time −2]) gives:

$$\sigma_{43} = -Q_{gT}\left[(1-\beta)\alpha\left(1, \frac{m}{2}, \frac{m}{2}\right) + \beta\alpha\left(2, \frac{m}{2}, \frac{m}{2}\right)\right] + \quad (20a)$$
$$Q_c\left[\alpha\left(1, \frac{m}{2}, \frac{m}{2}\right) + F\alpha\left(2, \frac{m}{2}, \frac{m}{2}\right)\right] -$$
$$Q_{13}\left[\alpha\left(1, \frac{m}{2}, \frac{m}{2}\right)\right] - Q_{23}\left[\alpha\left(2, \frac{m}{2}, \frac{m}{2}\right)\right],$$

$$\sigma_{21} = -Q_{13}\left[b_1^{-m-g}\alpha\left(1, \frac{m}{2}, \frac{m}{2}\right)\right] - Q_{23}\left[b_2^{-m-g}\alpha\left(2, \frac{m}{2}, \frac{m}{2}\right)\right], \quad (20b)$$

$$\sigma_{32} = Q_{gT}[(1-\beta)A_{1,m/2} + \beta A_{2,m/2}] - Q_c[A_{1,m/2} + FA_{2,m/2}] + \quad (20c)$$
$$Q_{13}\left[\alpha\left(1, \frac{m}{2}, -\frac{m}{2} - g\right)\right] + Q_{23}\left[\alpha\left(2, \frac{m}{2}, -\frac{m}{2} - g\right)\right].$$

These filters also exclude the step's rising edge for location insensitivity. While this is not a requirement of our invention, it significantly simplifies both the coefficient derivations and trigger system timing requirements.

3.2. The Four-filter Solution for $Q_{gT}$

Collecting results for the four filters listed at the start of §3.1, we have:

$$\sigma_\Sigma = Q_{gT}[(1-\beta)A_{1,m} + \beta A_{2,m}] - Q_c[A_{1,m} + FA_{2,m}] + \quad (21a)$$
$$Q_{13}[\alpha(1, m, -m-g)] + Q_{23}[\alpha(2, m, -m-g)]$$

$$\frac{\sigma_g}{r_1} = Q_{gT}\left[\frac{(1-\beta)A_{1,g} + \beta A_{2,g}}{r_1}\right] - Q_c\left[(2-b_1^g) + \frac{Fr_2}{r_1}(2-b_2^g)\right] + \quad (21b)$$
$$Q_{13}\left[\frac{\alpha(1, g, -g)}{r_1}\right] + Q_{23}\left[\frac{\alpha(2, g, -g)}{r_1}\right],$$

$$\sigma_{43} = -Q_{gT}\left[(1-\beta)\alpha\left(1, \frac{m}{2}, \frac{m}{2}\right) + \beta\alpha\left(2, \frac{m}{2}, \frac{m}{2}\right)\right] + \quad (21c)$$
$$Q_c\left[\alpha\left(1, \frac{m}{2}, \frac{m}{2}\right) + F\alpha\left(2, \frac{m}{2}, \frac{m}{2}\right)\right] -$$
$$Q_{13}\left[\alpha\left(1, \frac{m}{2}, \frac{m}{2}\right)\right] - Q_{23}\left[\alpha\left(2, \frac{m}{2}, \frac{m}{2}\right)\right],$$

$$\sigma_{21} = -Q_{13}\left[b_1^{-m-g}\alpha\left(1, \frac{m}{2}, \frac{m}{2}\right)\right] - Q_{23}\left[b_2^{-m-g}\alpha\left(2, \frac{m}{2}, \frac{m}{2}\right)\right], \quad (21d)$$

as four linear equations in four unknowns. The unknown parameters are of three types: 1) ($P_1$) the unknown charge $Q_{gT}$ (the area of the input impulse in the general case); 2) ($P_2$) charges describing the step's finite arrival time ($Q_g$) and the residual charges in the $\tau_1$ and $\tau_2$ decay modes ($Q_{13}$ and $Q_{23}$) from previous events; and 3) ($P_3$) a set of fixed parameters $\{\tau_1, \tau_2, \beta, m \text{ and } g\}$ which describe the preamplifier's (or N-1P device's) transfer function and the applied filters. Since the coefficients in [ ]'s are functions only of the $P_3$ parameters, they are constants which need be computed only once for a given preamplifier and filter set.

Eqns. 21 can be solved by several methods, including casting them into matrix notation and then inverting the coefficient matrix. Thus:

$$\begin{bmatrix} \sigma_\Sigma \\ \frac{\sigma_g}{r_1} \\ \sigma_{43} \\ \sigma_{21} \end{bmatrix} = \begin{bmatrix} (1-\beta)A_{1,m} + \beta A_{2,m} & -A_{1,m} - FA_{2,m} & \alpha(1, m, -m-g) & \alpha(2, m, -m-g) \\ \frac{(1-\beta)A_{1,g} + \beta A_{2,g}}{r_1} & -(2-b_1^g) - \frac{Fr_2}{r_1}(2-b_2^g) & \frac{\alpha(1, g, -g)}{r_1} & \frac{\alpha(2, g, -g)}{r_1} \\ -(1-\beta)\alpha\left(1, \frac{m}{2}, \frac{m}{2}\right) - \beta\alpha\left(2, \frac{m}{2}, \frac{m}{2}\right) & \alpha\left(1, \frac{m}{2}, \frac{m}{2}\right) + F\alpha\left(2, \frac{m}{2}, \frac{m}{2}\right) & -\alpha\left(1, \frac{m}{2}, \frac{m}{2}\right) & -\alpha\left(2, \frac{m}{2}, \frac{m}{2}\right) \\ 0 & 0 & -b_1^{-m-g}\alpha\left(1, \frac{m}{2}, \frac{m}{2}\right) & -b_2^{-m-g}\alpha\left(2, \frac{m}{2}, \frac{m}{2}\right) \end{bmatrix} \begin{bmatrix} Q_{gT} \\ Q_c \\ Q_{13} \\ Q_{23} \end{bmatrix} \quad (22)$$

becomes $$\sigma = J \cdot Q, \quad (23a)$$

so that $$Q = J^{-1} \cdot \sigma, \quad (23b)$$

and $$Q_{gT} = J_{11}^{-1} \sigma_\Sigma + J_{12}^{-1} \frac{\sigma_g}{r_1} + J_{13}^{-1} \sigma_{43} + J_{14}^{-1} \sigma_{21}. \quad (23c)$$

As a solution for $Q_{gT}$, Eqn. 23c has the advertized form: a weighted sum of the four filter outputs. The weighting coefficients $J_{ij}^{-1}$ are computed only once for a particular set of filters and $P_3$ parameters $\{\tau_1, \tau_2, \beta, m \text{ and } g\}$ and then multiplied by the four filter outputs $\sigma_\Sigma, \sigma_g/r_1, \sigma_{43}$ and $\sigma_{21}$ to obtain the total pulse charge $Q_{gT}$ (and hence the energy of the absorbed γ-ray) for each captured event. We note that if more filters are measured than there are parameters Q, the matrix can be inverted using least squares methods to obtain Eqn. 23b.

4. Evaluation for Two Filter Sets
4.1. A Four-filter Set with Typical Parameters We now evaluate a typical case of the filter set leading to Eqns. 22 and 23: we set m equal to 4 μs, g to 1 μs and assume typical values of $\tau_1 = 50$ μs and $\tau_2 = 1$ ms with a division ratio $\beta = 0.04$. In this case, for 40 MHz sampling, m=160, g=40 and we can compute $$J = \begin{bmatrix} 1.54041E+2 & -1.54138E+2 & -8.08795E+1 & -8.00411E+1 \\ 1.98087E-2 & -1.06150E+0 & -2.00007E-3 & -1.99953E-3 \\ -2.95906E+0 & 3.07604E+0 & -1.53785E+1 & -1.59682E+1 \\ 0.00000E+0 & 0.00000E+0 & -1.69959E+1 & -1.60483E+1 \end{bmatrix} \quad (24a)$$

$$J^{-1} = \begin{bmatrix} 6.309486E-3 & -9.623578E-1 & -1.593231E-2 & -1.549595E-2 \\ 1.190638E-4 & -9.600143E-1 & -2.284270E-4 & -2.469335E-4 \\ 1.194301E-2 & 6.874687E-2 & 6.221807E-1 & -6.786521E-1 \\ -1.264822E-2 & -7.280624E-2 & -6.589193E-1 & 6.564133E-1 \end{bmatrix}, \quad (24b)$$

and $$Q_{gT} = 6.309486E-3\sigma_\Sigma - 4.811789E-4\sigma_g - 1.593231E-2\sigma_{43} - 1.549595E-2\sigma_{21} \quad (24)$$

$\sigma_g$ is typically of order $0.25\sigma_\Sigma$, so the $\sigma_g$ term is typically less than 2% of $Q_{gT}$. In spite of its small size, however, $\sigma_g$ carries the burden of the ballistic deficit correction, since it is the only filter that probes the step's risetime directly.

The coefficients in Eqn. 24c also depend upon the value β. When the pole-zero is perfectly balanced, (β=0) Eqn. 24c becomes:

$$Q_{gT} = 6.309486E-3\sigma_\Sigma - 4.811789E-4\sigma_g - 1.593231E-2\sigma_{43} - 1.549595E-2\sigma_{21} \quad (25)$$

where $\sigma_g$'s coefficient has changed by 4%, $\sigma_\Sigma$'s by 0.04%, and the $\sigma_{43}$'s and $\sigma_{21}$'s by about 0.008%. The need for β accuracy is therefore a function of how accurately one wishes to correct for risetime fluctuations and pole-zero inaccuracies. The $J^{-1}$ weighting coefficients are found to vary linearly with β, which allows β to be determined experimentally if it is not precisely known. To do this, first select a set of β values bracketing its expected value and compute Eqns. 24 to produce a set of weights $$\{J_{1n}^{-1}(\beta)\}$$

(the coefficients in Eqn. 24C) for each β value. Next collect data for each weight set $$\{J_{1n}^{-1}(\beta)\}$$

and measure the standard deviation $\sigma Q_{gT}(\beta)$ in $Q_{gT}$ (i.e., the energy resolution) which is obtained. Then, by plotting or interpolating the $\sigma Q_{gT}(\beta)$ results versus β, select a β value which minimizes $\sigma Q_{gT}(\beta)$. If the preamplifier is stable, β should only need to be determined once.

We tested the accuracy of Eqn. 24c's in the presence of both risetime variations and a sizable $\tau_2$ decay term (equal to the $\tau_1$ step amplitude) using a spreadsheet to compute the filter responses for modeled waveforms. Table 1 presents these results. As may be seen, the Eqn. 24c is insensitive to both risetime fluctuations and $\tau_2$ components at the few ppm level and is three orders of magnitude better than a simple trapezoidal filter.

TABLE 1

Modeled charge $Q_{gT}$ for 5 filters in the presence of varying risetimes and $\tau_2$ amplitudes for the case of β equals 0.02.

| | Risetime = 450 ns | | Risetime = 950 ns | |
|---|---|---|---|---|
| Model | $<\tau_2> = 0$ | $<\tau_2> = 1$ | $<\tau_2> = 0$ | $<\tau_2> = 1$ |
| Triangular | 0.861966 | 0.859787 | 0.831149 | 0.827170 |
| | (100.00%) | (99.75%) | (96.43%) | (95.96%) |
| Trapezoidal | 0.867397 | 0.862421 | 0.863901 | 0.858928 |
| | (100.00%) | (99.43%) | (99.59%) | (99.02%) |
| Section 4.1 | 0.999997 | 0.999997 | 1.000001 | 1.000001 |
| (Eqn. 24c) | (100.000%) | (100.000%) | (100.000%) | (100.000%) |
| Section 4.2 | 1.000119 | 1.000113 | 1.000028 | 1.000022 |
| (Eqn. 33) | (100.000%) | (99.999%) | (99.991%) | (99.990%) |

4.2. A Three-filter Simplification which Still has Good Performance

For cases which do not demand the precision of Eqn. 24c, or have small $\tau_2$ components, we show a simpler, three-filter set which still has good performance. We use trapezoidal/triangular filters for their insensitivity to the "DC-like" slow variation in the $\tau_2$ component: namely the same "energy" and "risetime probe" filters as in §4.1 and a second trapezoidal filter $\sigma_{32}$ (Eqn. 20c), aligned to exclude the risetime region, to estimate $Q_{13}$. Thus:

$$\begin{bmatrix} -\sigma_\Sigma \\ \dfrac{\sigma_g}{r_1} \\ W\sigma_{32} \end{bmatrix} = \begin{bmatrix} -A_{1,m} & A_{1,m} & -\alpha(1, m, -m-g) \\ 0 & 1 & b_1^{-g}\dfrac{\alpha(1, g, -g)}{r_1} \\ wA_{1,\frac{m}{2}} & -wA_{1,\frac{m}{2}} & w\alpha\left(1, \dfrac{m}{2}, \dfrac{-m}{2}-g\right) \end{bmatrix} \begin{bmatrix} Q_{gT} \\ Q_c \\ Q_{13} \end{bmatrix}. \quad (26)$$

In Eqn. 26 we reversed the sign of $\sigma_\Sigma$ in order to create a filter that is differential on both sides of the step's rising edge and we weighted $\sigma_{32}$ by W to determine the value that gives the best results. We find the lowest noise is for W=1, so we can repeat Eqns. 24a and 24b to obtain:

$$Q_{gT} = 9.338925E{-}3\sigma_\Sigma - 5.000000E{-}4\sigma_g + 3.106015E{-}2\sigma_{32} \quad (27)$$

Table 1 shows that this result is sensitive to the $\tau_2$ component at the few ppm level and to risetime variations at the 100 ppm level. For many practical cases, this is sufficiently accurate. Assuming a random distribution of risetimes, for example, this would add less than 100 eV in quadrature to the energy resolution at 1 MeV, which would be scarcely perceptible.

5. Correlated Multiple Output Sampling in Real Time Implementations

5.1. Defining "Correlated Multiple Output Sampling"

The filter weighting Eqns. 25 and 27 derivations were developed as if the signals had been captured into memory, so the running-sums could simply be taken over the desired sample values. This implementation is feasible at lower data rates, but in the preferred implementation, as taught by WARBURTON-1997, a gate array is used to realize the difference of running-sum filters, which run in real time, each outputting a new value its own fixed number of clock cycles after a new ADC sample is supplied. A priori, then, there may be no single instant when a set of filter values can be captured which will reproduce the inter-filter time relationships required by Eqns. 25 and 27. Instead, in general, the outputs of the different filters will have to be captured at different times and these times will have to be carefully correlated if Eqns. 25 and 27 are to produce accurate values of $Q_{gT}$. Because multiple filter values must be captured, we call the resultant set of captured values a "correlated multiple output sample" or "cMOS" and refer to these values either as "cMOS values" or as "individual sample values in the cMOS".

We also observe that the number of cMOS values required by Eqns. 25 and 27 and number of realized filters needed to produce them need not be the sane. For example, in Eqn. 25, the $\sigma_{21}$ and $\sigma_{43}$ filter values both come from triangular filters of length m/2 with their starting points separated by the interval m+g. Thus two outputs from the same realized filter can be captured to supply the two required values.

While we have noted that the filter ranges do not have to be precisely positioned relative to the step's rising edge, the accuracy of their positions relative to one other in the cMOS capture determines the accuracy that the method can attain. This is because the running-sum ranges, which translate directly into filter lengths and time intervals between starting locations, are encoded into the $J^{-1}$ weighting coefficients through terms like $\alpha(j,r,s) = A_{j,r}(1-b_j^s)$ (see, e.g., Eqn. 6), where r is the filter length and s the interval between the sum start points. For simplicity, we aligned the various filters so their starting points coincided, but other cases are trivially treated by scaling Eqns. 4–7 by terms like $b_j^t$, where t is the offset between starting locations. Therefore, there is an intimate relationship between the weighting coefficients and the filter ranges which, if violated, will introduce inaccuracies. The $J^{-1}$'s are computed for a particular set of filter sum ranges. If another set of ranges is captured, then expected cancellations between filter terms will not occur exactly and the differences will appear as errors in the detected charge. In digital implementations, the fact that the signal samples are discrete and enumerated makes is relatively easy to maintain accurate time relationships by measuring time in "ticks" of the digitization clock and then simply counting out the required time intervals.

The requirement of appropriate time correlations between the cMOS values clearly differentiates the present method from prior art as represented by the approaches of HINSHAW-1991 and KUMAZAWA-1988. While two filter outputs were captured and weighted in those methods, the capturing steps used peak detecting means. The methods are therefore amplitude based rather than time based, as in the present method, and the captured values carry different information about the step shapes. Further, the method of capturing based on peak detection assures that there will be no fixed time relationship between the captured samples since the two filters' times of maximum amplitude depend differently on step shape, which will vary from step to step.

In light of the above, it is clear that there will be a wide variety of possible approaches to capturing filter cMOS values with the prescribed time relationships. The outputs of single filters can be captured multiple times. Filter outputs can be captured as they appear from the gate array or can be delayed for convenience. We will show several examples in §6. Which method is best will depend upon implementation details and will vary from case to case. We therefore intend the phrase "cMOS" (for "correlated multiple output sample") to cover the multiplicity of possibilities for capturing, in a real-time implementation, filter values whose time relationships are correct for the set of $J^{-1}$ weighting coefficients that will be applied to them to recover the input charge from the detected event. When the cMOS capture is made in response to the detection of a step in the preamplifier's output signal, with the intention of using it to determine the charge deposited in the detector (in the general case the impulse area) and hence the gamma-ray's energy, we will often refer to it as an "energy cMOS capture" (or "charge cMOS capture" or "area cMOS capture" as appropriate).

5.2. Timing Considerations

Filters, in real time implementations, require finite times to compute. For example, consider a trapezoidal filter of length (risetime) m and gap g over a set of values $\{q_i\}$, where $q_n$ is the last sample value ("end sample") to enter the filter:

$$\sigma_\Sigma(n) = \sum_{i=n-m}^{n} q_i - \sum_{i=n-2m-g}^{n-m-g} q_i. \quad (28)$$

If implemented in gate arrays according to the method of WARBURTON-1997, the output $\sigma_\Sigma(n)$ will appear 3 filter clock cycles after sample $q_n$ is presented. This is its propagation delay. For a 4 $\mu$s peaking time (filter clock equals 200 ns), the propagation delay is 600 ns. These delays must be included in the design to assure that the cMOS capture constraints are satisfied.

Figure 5A:
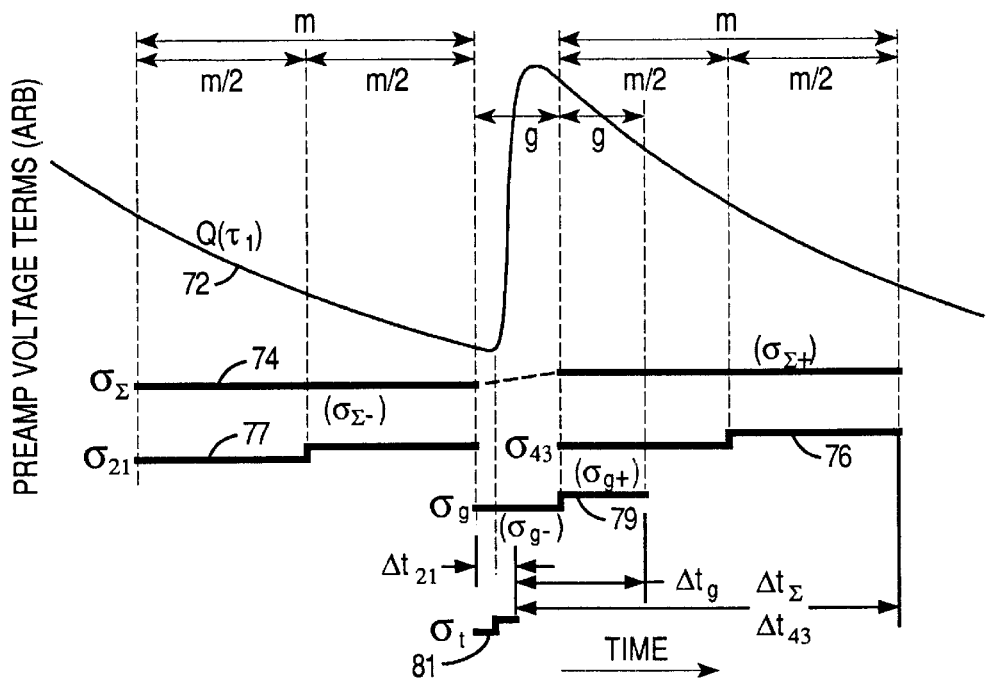
FIGS. 5A and 5B show how to compute the appropriate intervals between capture times of the multiple filters.
Figure 5B:
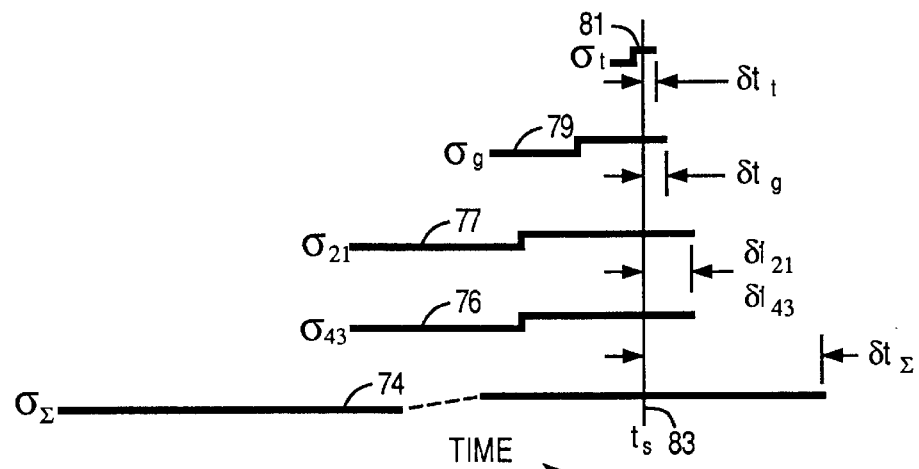

FIGS. 5A and 5B show how to compute sampling times for the Eqn. 24c filter set. The calculation has two steps: finding the time delays between their end samples of the different filters and then correcting for their different propagation delays. For the first step we use FIG. 5A, which shows the filter regions relative to the preamplifier output step 72. $\sigma_\Sigma$ 74, $\sigma_{43}$ 76, $\sigma_{21}$ 77, and $\sigma_g$ 79 were all described earlier. $\sigma_t$ 81 is a fast channel timing filter, as described by WARBURTON-1997, which is used to detect step-like signals in the preamplifier's output. The timing filter's output triggers a digital discriminator when it is located approximately as shown with respect to the leading edge of the signal step 72. We can now measure end sample delays relative to $\sigma_t$ 81 as shown, with the filters $\sigma_\Sigma$ 74, $\sigma_{43}$ 76, and $\sigma_g$ 79 appearing at times $\Delta t_\Sigma$, $\Delta t_{43}$, and $\Delta t_\Sigma$ after $\sigma_t$ 81 and $\sigma_{21}$ 77 appearing $\Delta t_{21}$ earlier. From FIG. 5A, if $\sigma_t$ has a peaking time of T, then $\Delta t_\Sigma$ equals (m+g−2T).

It is important to note that, while the firing of $\sigma_t$ may jitter somewhat depending upon the step's risetime shape, this only causes the step location to jitter within the gap g. The relative timings of all the filters to $\sigma_t$, and thus to each other, are fixed by construction. Thus, provided $\sigma_g$ is wide enough to catch the step for any reasonable discriminator triggering, the filter will work as designed. This relative insensitivity to the timing accuracy with which the step-like signals are detected is a significant advantage of the present invention.

FIG. 5B shows the second step: correcting for propagation delays. We note that these delays may exceed a microsecond in long time constant filters and typically increase with filter length. FIG. 5B shows propagation delays with respect to the ADC sample time $t_s$ 83 for a 40 MHz implementation with g=1 $\mu$s and m=4 $\mu$s, so $\delta t_t$=75 ns, $\delta t_g$=$\delta t_{21}$=$\delta t_{43}$=300 ns, and $\delta t_\Sigma$=1,200 ns. Combining FIGS. 5A and 5B, we should sample the output of a given filter $\sigma_x$, at $$t_x = \Delta t_x + \delta t_x - \delta t_t \quad (29)$$

following the discriminator firing on $\sigma_t$'s output to assure the cMOS temporal relationships required to extract $Q_{gT}$. If $t_x$ is positive, then a counter can be used to measure $t_x$ and capture the filter value. If $t_x$ is negative, however, then its propagation delay $\delta t_x$ will have to be increased by at least $|t_x|$ to meet the demands of causality (capturing must follow step detection in time). In digital implementations this is a simple operation using a FIFO memory. In our present example, no additional delay is required since a typical timing filter peaking time is 100 ns, so $\Delta t_{21}$=−200 ns and $$t_{21} = \Delta t_{21} + \delta t_{21} + \delta t_t = -200 + 300 - 75 = 25 \text{ ns}, \quad (30)$$

which is positive.

6. Circuits Implementing the cMOS Method
6.1. Fully Digital Filter Implementations Two general approaches are possible: 1) asynchronously capturing values as they appear from the sub-filters, per the discussion of Sect. 5.2, and 2) extending the filters' propagation delays so that they can be synchronously captured. In the latter case all pileup inspection is carried out before the capture signal is given, while in the former case the values are captured as they appear and the pileup inspection is used to decide whether anything should be done with them afterwards. We will demonstrate one implementation of each to show the principles.

6.1.1. Asynchronous Capture Implementation

Figure 6A:
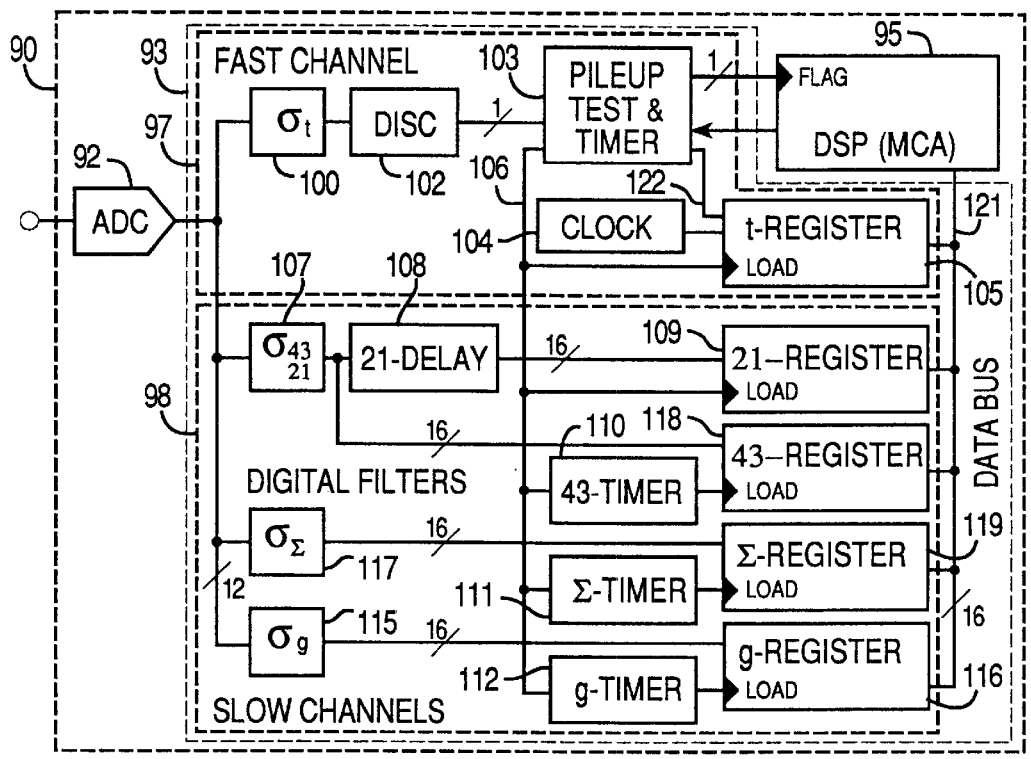
FIGS. 6A and 6B show a pair of purely digital circuits which implement the described method.

FIG. 6A shows a preferred implementation of Eqn. 24c. The digital processor 90 comprises an ADC 92, a real-time digital processing unit (RT-DPU) 93, and a digital signal processor (DSP) 95. Per the method taught by WARBURTON-1997, the RT-DPU processes data at the ADC output rate while the DSP processes data at the event rate (impulse signal rate). The RT-DPU produces values $\sigma_\Sigma$, $\sigma_{43}$, $\sigma_{21}$, and $\sigma_g$, while the DSP multiplies them by the coefficients $J^{-1}$ to obtain $Q_{gT}$.

The RT-DPU 93 also has two parts, a fast channel 97 and a number of slow channels 98. The fast channel contains the fast timing filter $\sigma_t$ 100, a digital discriminator 102, some pileup test and timer logic 103, a clock 104, and an output register 105. Each slow channel comprises a triangular or trapezoidal digital filter and an output register with either a digital delay line (if Eqn. 29 is negative) or a timer (if Eqn. 29 is positive). Notice that $\sigma_{43}$ and $\sigma_{21}$, both being of length m/2, are being implemented using a single triangular filter $\sigma_{4321}$ 107.

In operation, $\sigma_t$ 100 processes ADC 92 data until a step-like signal arrives. Discriminator 102 detects this step and signals the pileup inspector 103, which strobes a trigger line 106 and initiates pileup inspection. If the step's arrival time is important, the output of clock 104 can be captured to output register 105 by the same strobe signal 106. Filter $\sigma_{4321}$'s 107 output, delayed by $t_{21}$ using 21-delay 108 if required by Eqn. 29 causality, is captured immediately in the 21-register 109 by this trigger strobe, which also starts the 43-timer 110, $\Sigma$-timer 111, and g-timer 112 to time $t_{43}$, $t_\Sigma$ and $t_g$. Since $t_g$ is shortest, the g-timer 112 times out first, capturing filter $\sigma_g$'s 115 output in the g-register 116. Similarly, the 43-timer 110 and $\Sigma$-timer 111 time out at $t_{43}$ and $t_\Sigma$ to capture filter $\sigma_{4321}$ 107 and $\sigma_\Sigma$ 117 outputs in the 43-register 118 and $\Sigma$-register 119. If this step is not piled up, then all four filter values are ready to be read into the DSP 95 via data bus 121. The pileup inspector can be implemented as taught by WARBURTON-1999 relative to the length of the $\sigma_\Sigma$ filter and will not be discussed further.

As per the cMOS discussion in §5.1, the invention method does specifically require that the number of filters equal the number of filter values to be captured. Here we have captured $\sigma_{4321}$ twice.

6.1.2. Synchronous Capture Implementation

Figure 6B:
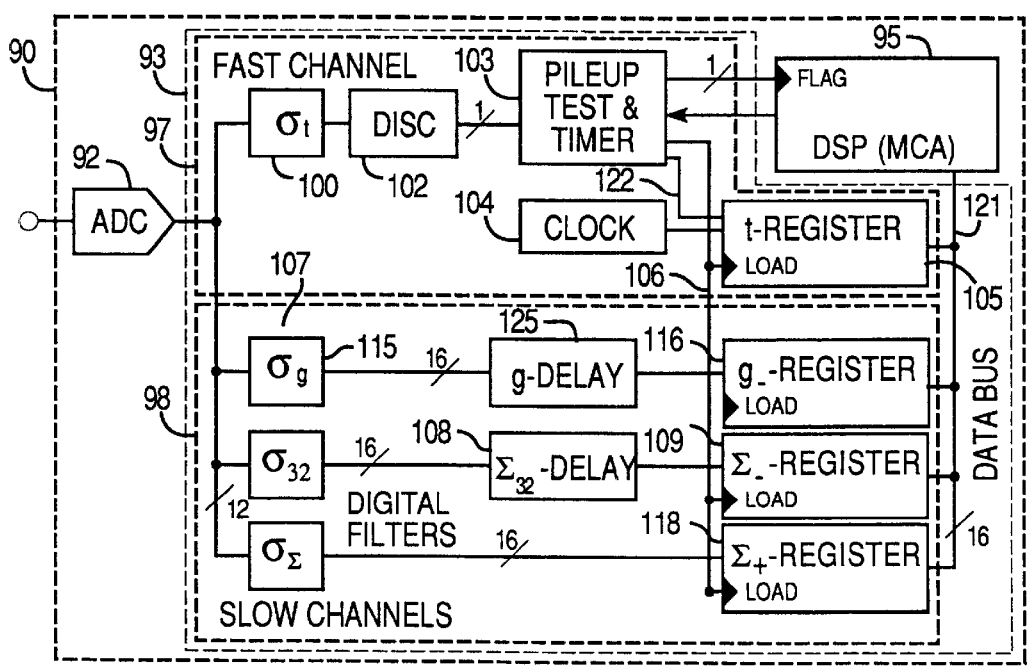

FIG. 6B shows an implementation of Eqn. 27 wherein the three filter values are captured just as the value emerges from the slowest ($\sigma_\Sigma$) filter. The primary physical difference between this implementation and that of FIG. 6A is that the timers 108, 109, and 110 have been eliminated and a second delay (g-delay 125) has been added to compensate for the differences between $t_\Sigma$ and $t_g$ and $t_{32}$ from Eqn. 29. All the remaining parts are the same and carry the same reference numbers as is FIG. 6A. Notice that the trigger line 106 now connects directly to the output registers, rather than through timers as before. For this topology, the functional operation of the pileup test and timer #1 103 is essentially identical to that presented by WARBURTON-1999.

A disadvantage of this circuit, compared to FIG. 6A, is that relatively long delays may be required, which may consume excessive gate array resources. Recent programmable gates, however, are appearing with blocks of dedicated memory, so this restriction is becoming less significant. One significant advantage of this design is that, because of the synchronous capture, the pileup inspection logic design is much simpler.

6.2. Fully Analog Implementation

Figure 7:
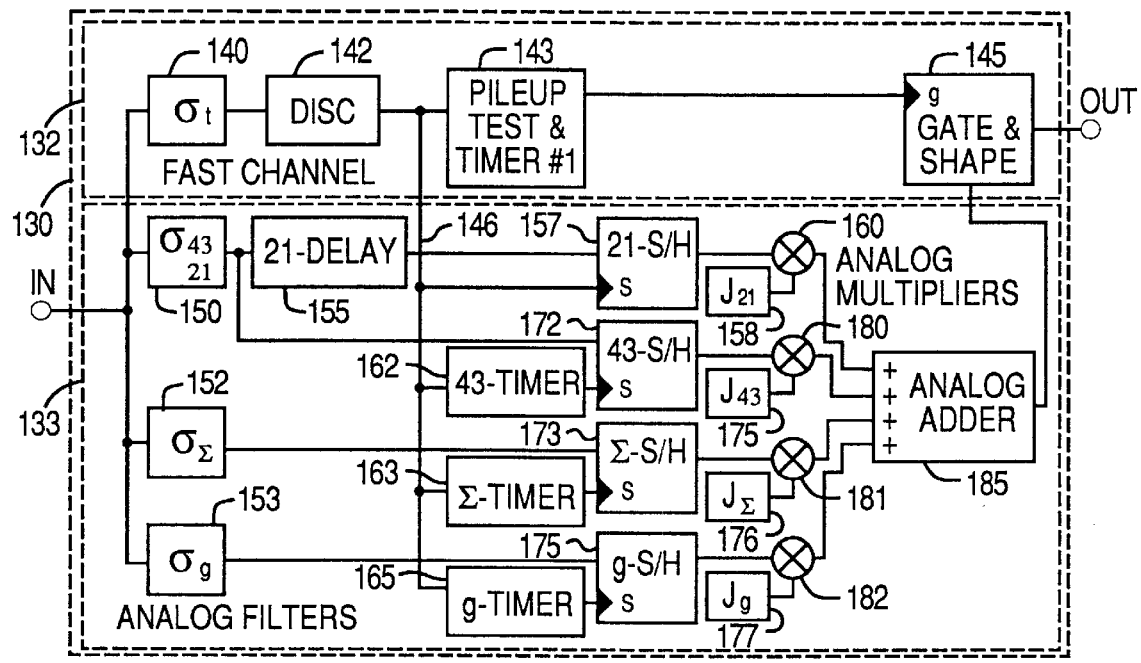
FIG. 7 shows a purely analog circuit which implements the described method.

While our preferred implementation is fully digital, the method is not inherently digital per se. In certain cases, particularly for very fast step risetimes and very short filter time constants, or to allow a high degree of integration, it may become preferable to use an analog implementation. FIG. 7 shows an analog version of FIG. 6A. The topologies are identical up to the point where sample and hold circuits replace digital registers to capture the filter values, so the operation of the circuit up to this point will be clear to one skilled in the art, given the teaching presented herein. The derivation of the J matrix, of course, will have to proceed using weighting functions appropriate for the analog filters used. Then analog multipliers (160, etc.) and an analog adder 185 are used to implement the $J^{-1}$ coefficients and addition of Eqn. 24c. We note that, for an application with fixed filters, the multiply-and-add function is just an op-amp circuit with appropriate resistor inputs to its summing node. If the pileup tester 143 deems the value good, the gate and shape circuit 145 passes out the adder 185 output in a form suitable for multichannel analysis.

6.3. Hybrid Implementations

Figure 8:
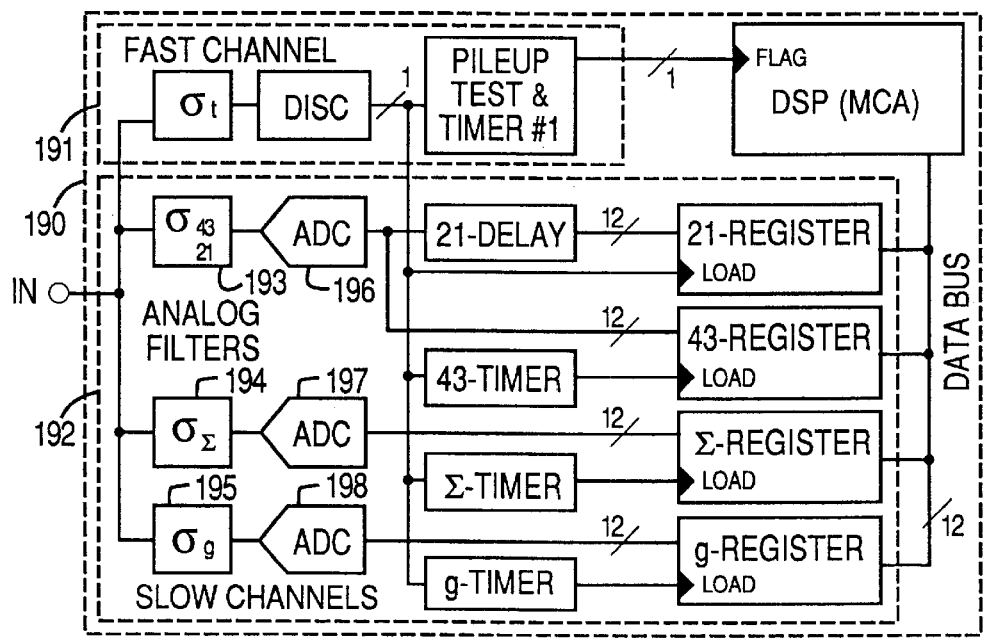
FIG. 8 shows a hybrid analog/digital circuit which implements the described method.

Shaping filter characteristics which are difficult to implement digitally may be required in some situations where the other benefits of digital processing are still desired. In these situations hybrid implementations may be considered. FIG. 8 shows one such implementation 190. The topology is nearly identical to that of FIG. 6A. The major differences are: 1) that the fast channel 191 is implemented in analog circuitry identical to that of FIG. 7 (although the digital circuit of FIG. 6A could as easily be used); and 2) that, in the slow channel section 192, the digital filters $\sigma_{4321}$ 107, $\sigma_\Sigma$ 117, and $\sigma_g$ 115 have been replaced by analog filters $\sigma_{4321}$ 193, $\sigma_\Sigma$ 194, and $\sigma_g$ 195 followed by ADCs 196, 197, and 198. The time behavior of this circuit is the same as was described for the asynchronous digital circuit in FIG. 6A.

7. Noise Considerations

The Eqns. 24C and 27 filters have higher noise than simple trapezoidal filters since they weight the sampled set of data points with values larger than unity. For example, by breaking the 2m+g filtered region of Eqn. 27 into its 4 major sub-regions of length m/2 (ignoring the gap g for this argument) and calling running-sums over these regions $\sigma_1$ through $\sigma_4$, we can recompose Eqn. 27 as:

$$Q_{gT} \cong 9.338925E-3\sigma_4 + 2.172123E-2\sigma_3 - 2.172123E-2\sigma_2 + 9.338925E-3\sigma_1, \quad (31)$$

If the noise standard deviation per sample is $\sigma$, then the total noise $sig(Q_{gT})$ will be $$sig(Q_{gT}) = (160(8.722E-5\sigma^2) + 160(4.718E-4\sigma^2))^{0.5} = 0.299\sigma, \quad (32)$$

which can be compared to a trapezoidal filter of the same length:

$$sig(Q_1) = \left(160\left(\frac{\sigma}{160}\right)^2 + 160\left(\frac{\sigma}{160}\right)^2\right)^{0.5} = 0.112\sigma. \quad (33)$$

Thus the Eqn. 27 filter will have approximately 2.7 times as much electronic noise as a simple trapezoidal filter. The result for the Eqn. 24c filter is similar. For a 4 μs filter, whose electronic noise can be as low as 150 eV, this effect is significant at energies like 100 keV (Fano noise 415 eV) but not at 1 MeV (Fano noise 1,300 eV). And, as peaking times shorten to obtain higher count rates, the problem will worsen at higher energies. We therefore consider how to obtain the benefits of correcting for both ballistic deficit and pole-zero errors without paying the additional filter noise price.

8. Treating Non-ideal Terms with Baseline Measurements

Our approach is to extend the baseline averaging concept of WARBURTON-1997 to treat time varying terms as well. In the particular case at hand, we would like a way to measure $Q_{23}$ using baseline measurements in spite of the fact that it both exhibits exponential decay and is increased each time an event occurs.

8.1. Derivation of an Example Filter

We begin by developing a simple cMOS filter, composed of three running averages, of lengths m, g, and m, which we make contiguous for the practical reasons of simplifying the math and minimizing deadtime, but not for any fundamental reason. As in previous sections, the length m filters will primarily serve to determine $Q_{gT}$, while the length g filter will be used to eliminate ballistic deficit effects by probing the signal step's 30 risetime region. Starting with Eqns. 19A, 19B, and 19D, these filters are:

$$\sigma_{\Sigma+} = Q_{gT}\bar{A}_m - Q_c\hat{A}_m + Q_{13}A_{1,m} + Q_{23}A_{2,m} + mB_0, \quad (34a)$$

$$\sigma_g = Q_c\dot{r} + Q_{13}b_1^{-g}A_{1,g} + Q_{23}b_2^{-g}A_{2,g} + gB_0, \quad (34b)$$

and $$\sigma_{\Sigma-} = +Q_{13}b_1^{-m-g}A_{1,m} + Q_{23}b_2^{-m-g}A_{2,m} + mB_0, \quad (34c)$$

where $$\bar{A}_m = (1-\beta)A_{1,m} + \beta A_{2,m}, \hat{A}_m = A_{1,m} + FA_{2,m}, \dot{r} = r_1 + Fr_2 \quad (34d)$$

In Eqns. 34 we now have 4 types $P_i$ of parameters: Types 1 and 2 ($P_1$, $P_2$), as before, which include $Q_{gT}$, $Q_c$, and $Q_{13}$; type 3 ($P_3$), $Q_{23}$ and $B_0$, which describe the preamplifier's "non-ideal" behavior, $Q_{23}$ being the amplitude of its second pole's response to any previous steps and $B_0$ being the DC offset; and type 4 ($P_4$): all the remaining fixed parameters (e.g., $\tau_1$, $\tau_2$, $\beta$, m, g) which describe both the filters' and the preamplifier's transfer functions. We will treat $Q_{gT}$, $Q_c$, and $Q_{13}$ as unknowns to be recovered from a particular cMOS filter measurement, with the intention of independently determining $Q_{23}$ and $B_0$ from baseline measurements. Eqns. 34 are simple enough to be solved by direct elimination of unknowns to get:

$$Q_{gT} = \bar{A}_m^{-1}\left[\sigma_{\Sigma+} - K\sigma_{\Sigma-} + \frac{\hat{A}_m}{\dot{r}}\sigma_{g-}\right]_q - \bar{A}_m^{-1}[LQ_{23} + MB_0], \quad (35a)$$

where $$K = b_1^{m+g} + \frac{\hat{A}_m}{\dot{r}}\frac{A_{1,g}}{A_{1,m}}b_1^m, \quad (35b)$$

$$L = A_{2,m}\left[1 - \left(\frac{b_1}{b_2}\right)^{m+g} + \frac{\hat{A}_m A_{2,g}}{A_{2,m}\dot{r}}b_2^{-g} - \frac{\hat{A}_m A_{1,g} A_{2,m}}{A_{1,m}\dot{r}}b_1^{-g}\left(\frac{b_1}{b_2}\right)^{m+g}\right], \quad (35c)$$

and $$M = m\left[1 - b_1^{m+g} + \frac{\hat{A}_m}{\dot{r}}\left[\frac{g}{m} - \frac{A_{1,g}}{A_{1,m}}b_1^m\right]\right]. \quad (35d)$$

The constants K, L, and M depend only on type 4 parameters, which are assumed to be time independent for a particular detector-preamplifier pair and set of filter lengths. Eqn. 35A is therefore a transform function (the first bracketed term) between the Eqn. 34 cMOS filter values $\sigma_{\Sigma+}$, $\sigma_{\Sigma-}$, $\sigma_{g-}$ and the desired detector charge $Q_{gT}$, minus an error term $[LQ_{gT}+MB_0]\overline{A}_m^{-1}$, that is the transform's response to the non-ideal (NI) preamplifier terms $Q_{23}$ and $B_0$. Using Eqn. 35a thus requires that $Q_{23}$ and $B_0$ to be determined at a time appropriately correlated to the cMOS capture (e.g., time 1 in FIG. 4) and substituted into the error term to produce an accurate value of $Q_{gT}$. The cMOS capture itself can be physically implemented using any of the approaches described above. The subscript q on the bracketed weighted sum of cMOS values indicates that this was an "area" cMOS capture of the area filter set to determine deposited charge.

8.2. Single Measurement Error Term Correction

A simple, although not the lowest noise, method to estimate the error term is to measure it locally for each cMOS energy capture by making the same Eqn. 34 cMOS filter capture in close time proximity but without a step-like signal present in the filters, so that $Q_{gT}$ is zero. Then, from Eqn. 35a, with $Q_{gT}$ equal to zero, we have:

$$\overline{A}_m^{-1}[LQ_{23}+MB_0]_b = \overline{A}_m^{-1}\left[\sigma_{\Sigma+} - K\sigma_{\Sigma-} + \frac{\hat{A}_m}{\dot{r}}\sigma_{g-}\right]_b, \quad (36)$$

where the subscript b is for "baseline", called so since, as shown, this "baseline" cMOS filter capture produces the transform's baseline response to the preamplifier's non-ideal terms. We may also call such a measurement a "null charge" or "null energy" ("null area" in the general case) capture since it is made when $Q_{gT}$ is zero. Substituting Eqn. 34c into Eqn. 33A gives:

$$Q_{gT} = \overline{A}_m^{-1}\left[\left[\sigma_{\Sigma+} - K\sigma_{\Sigma-} + \frac{\hat{A}_m}{\dot{r}}\sigma_{g-}\right]_q - \left[\sigma_{\Sigma+} - K\sigma_{\Sigma-} + \frac{\hat{A}_m}{\dot{r}}\sigma_{g-}\right]_b\right], \quad (37)$$

where the subscript q labels the cMOS charge measurement to be corrected.

This correction is moderately simple and has been found to work acceptably in some cases. However, if $Q_{23}$ is large, as may be true at high output step rates, then time decay effects in $[LQ_{23}+MB_0]_b$ may still be significant. This can be approximately corrected by measuring the time interval $\delta t = t_e - t_b$ (in clock ticks $\Delta t$) between the energy and baseline captures and correcting by the decay term $b_2^{\delta t}$, to obtain:

$$Q_{gT} = \quad (38)$$
$$\overline{A}_m^{-1}\left[\left[\sigma_{\Sigma+} - K\sigma_{\Sigma-} + \frac{\hat{A}_m}{\dot{r}}\sigma_{g-}\right]_q - b_2^{\delta t}\left[\sigma_{\Sigma+} - K\sigma_{\Sigma-} + \frac{\hat{A}_m}{\dot{r}}\sigma_{g-}\right]_b\right].$$

In this method, if $B_0$ is truly a constant and the time interval $\delta t$ between the energy and baseline captures is fixed, then the error term $MB_0 b_2^{\delta t}$, will also be a constant and merely produce an offset in the spectrum.

Eqn. 38 has two significant problems: 1) increased noise, due to the noise in the single baseline measurement, which is the same size as in the measurement itself and degrades resolution by sqrt(2); and 2) it increases deadtime by at least a factor of two if the two measurements are independent and so separated by at least 2 m+g in time. It is therefore useful to be able to make multiple, independent measurements of $B_0$ and $Q_{23}$ and average them in order to reduce their variance. We present a method for doing so below.

8.3. The Time Compensated Baseline Model

In making filter derivations throughout this work, we have assumed that we have an accurate preamplifier model in terms of its several decay constants and DC offset. We therefore take the logical step and use precisely the same model to correlate measurements made at different times so they may be averaged. Thus, if we measure $Q_{13}$, $Q_{23}$, or $B_0$ at one time, then their values $\Delta t$ clock cycles later will be given by $b_1^{\Delta t}Q_{13}$, $b_2^{\Delta t}Q_{23}$, and $B_0$, respectively, unless a step arrives within the interval $\Delta t$. In that case, at the end of the step arrival time (e.g., time 1 in FIG. 4), we increment $Q_{13}$ by $(1-\beta)Q_{gT}$, $Q_{23}$ by $\beta Q_{gT}$, and $B_0$ by zero, after which their exponential decays will continue as before. For the purposes of baseline averaging, then, $Q_{13}$, $Q_{23}$, or $B_0$ become "time-compensated" model (or "TC-model") parameters, whose averaged values are $<Q_{13}>$, $<Q_{23}>$, and $<B_0>$, respectively.

If we make measurements of $B_0$ and $Q_{23}$ from time to time, we can now update our estimate of $B_0$ simply by using the method of WARBURTON-1997 or some other averaging scheme. For $Q_{23}$ our TC-model now gives:

$$Q_{23}(i) = b_2^{\Delta t}Q_{23}(i-1), \quad (39)$$

so, if $<Q_{23}>_{i-1}$ represents an "averaged" estimate of $Q_{23}(i-1)$, last measured at time $t_{i-1}$, we update $<Q_{23}>_i$, using a new baseline measurement of $Q_{23}(i)$ at time $t_i$, by the following extension of Warburton and Hubbard's Eqn. 7, where $\Delta t_i = t_i - t_{i-1}$:

$$<Q_{23}>_i = \frac{N-1}{N}\left(b_2^{\Delta t_i}<Q_{23}>_{(i-1)}\right) + \frac{Q_{23}(i)}{N}. \quad (40)$$

Equivalently, we update $<Q_{23}>$ for the arrival of an impulse signal of charge $Q_{gT}(i)$ at time $t_i$ using:

$$<Q_{23}>_i = b_2^{\Delta t_i}<Q_{23}>_{(i-1)} + \beta Q_{gT}(i). \quad (41)$$

If required, $Q_{13}$ can be similarly extended from its last time of measurement by replacing $b_2$ with $b_1$ in Eqn. 39.

$<Q_{23}>$ and $<B_0>$ are used with an charge cMOS capture to determine $Q_{gT}$ using Eqn. 35a as follows. First, $<B_0>$ simply replaces $B_0$ in the equation. $<Q_{23}>$, however, has to be extended from its time of last update $t_{i-1}$ to the present capture time $t_i$ using Eqn. 39, according to our TC-model, where $\Delta t_i = t_i - t_{i-1}$:

$$Q_{gT} = \overline{A}_m^{-1}\left[\sigma_{\Sigma+} - K\sigma_{\Sigma-} + \frac{\hat{A}_m}{\dot{r}}\sigma_{g-}\right]_q - \overline{A}_m^{-1}\left[Lb_2^{\Delta t_i}<Q_{23}>_{i-1} + M<B_0>\right] \quad (42)$$

Because $<Q_{23}>$ and $<B_0>$ can be determined by averaging over many baseline measurements, the noise contribution of the correction term in Eqn. 42 can be made much smaller than in the single baseline correction procedure of §8.2. Since the weighting function of $\sigma_{g-}$ is small compared to unity, the measurement noise in Eqn. 42 will then be determined primarily by $\sigma_{\Sigma+}$ and $\sigma_{\Sigma-}$, and will be approximately the same as for a trapezoidal filter of the same peaking time and about a factor of sqrt(2) better than by using Eqn. 38. Furthermore, because a baseline cMOS filter capture can now be made at any time the interval between successive steps is adequately long, rather than requiring one in conjunction with each charge cMOS filter capture, the method's deadtime is cut in half: to that of a single cMOS filter capture.

8.4. Measuring the Non-ideal Terms $Q_{23}$ and $B_0$

An effective way to measure $Q_{23}$ at time $t_i$ is by making a baseline cMOS capture, per Eqn. 36, with the difference now that the times $t_i$ need no longer be correlated with charge cMOS captures. Using an averaged value $<B_0>$ for $B_0$, plus computed values for L and M, we can then solve $[LQ_{23}+MB_0]_b$ for $Q_{23}$:

$$Q_{23} = \frac{1}{L}\left[\sigma_{\Sigma+} - K\sigma_{\Sigma-} + \frac{\hat{A}_m}{\hat{r}}\sigma_{g-}\right]_b - \frac{M}{L}B_0 \quad (43)$$

and use it to update $<Q_{23}>_i$ using Eqn. 40.

We normally expect $B_0$ to be stable and nominally rate independent, so that $<B_0>$ can be measured with no input counts to the detector and used thereafter to obtain $Q_{23}$ values. However, to compensate for any temperature and/or rate related changes in $B_0$, it is prudent to also measure $B_0$ from time to time and update our estimate of $<B_0>$. One approach is to use pairs of baseline measurements, separated in time by $\Delta t$, where, if we denote the error term E as:

$$E = [LQ_{23} + MB_0]_b = \left[\sigma_{\Sigma+} - K\sigma_{\Sigma-} + \frac{\hat{A}_m}{\hat{r}}\sigma_{g-}\right]_b. \quad (44)$$

then, measuring $E_i$ and $E_{i-1}$ separated by $\Delta t = t_i - t_{i-1}$, we have, from Eqn. 39:

$$B_{0,i} = (E_i - b_2^{\Delta t_i}E_{(i-1)})(M(1 - b_2^{\Delta t_i}))^{-1}. \quad (45)$$

$B_{0,i}$ measurements can be averaged, as noted above, to obtain $<B_0>$, a low variance estimation of $B_0$, for use in Eqn. 35a. From Eqn. 45, it is clear that the longer the time interval $\Delta t$, the more accurate the measurement of $B_0$ will be, since both the numerator and denominator are small differences of large numbers. In any case, enough values $B_{0,i}$ can be averaged so that errors in $<B_0>$ do not contribute substantially to the error in $Q_{gT}$.

8.5. Dealing with Model Parameter Drifts

For this compensation scheme to work well, the $P_4$ parameter $\beta$ needs to be precisely known and stable over time. Else both the extrapolations of $Q_{13}$ and increments in $Q_{23}$ will incorporate systematic errors which will propagate into the $Q_{gT}$ calculations. The proposed $Q_{23}$ baseline measurements offer a method to monitor $\beta$ and either refine its value or track it in time.

In Eqn. 40 we update our average $<Q_{23}>_i = b_2^{\Delta t}<Q_{23}>_{i-1}$ at time $t_i$ with the measured value $Q_{23}(i)$. However, we can also record the differences between these two values and compute their mean $<\Delta Q_{23}>$ over time. If $<\Delta Q_{23}>$ is not zero, then a systematic error exists and we can adjust $\beta$ using:

$$\delta\beta = <\Delta Q_{23}>/S_\beta, \quad (46)$$

where the slope $S_\beta = d<\Delta Q_{23}>/d\beta$ is previously obtained from calibration runs, made at system setup time, wherein $\beta$ is systematically adjusted and the resultant $<\Delta Q_{23}>$ values recorded, so that $S_\beta$ can be calculated. Similar methods can be used to monitor and correct other $P_4$ parameters such as $\tau_1$ and $\tau_2$, if appropriate.

9. References

The following are incorporated by reference:

AALSETH-1998: "Using pulse shape discrimination to sort individual energy deposition events in a germanium crystal", C. E. Aalseth, F. T. Avignone III, R. L. Brodzinski, H. S. Miley, and J. H. Reeves in Journal of Radioanalytical and Nuclear Chemistry, Vol.233, Nos 1–2 (1998) 119–123.

GOULDING-1988: "Ballistic Deficit Correction in Semiconductor Detector Spectrometers", F. S. Goulding and D. A. Landis, I.E.E.E. Trans. Nuclear Science, Vol. 35, No. 1, (1988) 119–124.

HINSHAW-1991: U.S. Pat. No. 5,021,664, issued Jun. 4, 1991 to S. M. Hinshaw for "Method and apparatus for correcting the energy resolution of ionizing radiation spectrometers".

KNOLL-1989: "Radiation Detection and Measurement, 2nd Ed." by Glenn F. Knoll (J. Wiley, New York, 1989)

KUMAZAWA-1988: U.S. Pat. No. 4,727,256, issued Feb. 23, 1988 to Y. Kumazawa for "Semiconductor radiation detector".

MILLER-1994: U.S. Pat. No. 5,347,129, issued Sep. 13, 1994 to W. H. Miller and R. R. Berliner for "System for determining type of nuclear radiation from detector output pulse shape".

RADEKA-1982: "Trapezoidal Filtering of Signals from Large Germanium Detectors at High Rates", V. Radeka, I.E.E.E. Trans. Nuclear Science, Vol. NS-19 (1982) 412–428.

RAUDORF-1982: "Pulse Shape and Risetime Distribution Calculations for HPGe Coaxial Detectors", T. W. Raudorf, M. O. Bedwell and T. J. Paulus, I.E.E.E. Trans. Nuclear Science, Vol. NS-29, No. 1 (1982) 764–768.

SIMPSON-1990: U.S. Pat. No. 4,937,452, issued Jun. 26, 1990 to M. L. Simpson and T. W. Raudorf for "Charge trapping correction in photon detector systems".

STAHLE-1999: "Design and performance of the Astro-E/XRF microcalorimeter array and anti-coincidence detector", C. K. Stahle et al., in Proc. of the SPIE No. 3765, "EUV, X-ray and Gamma-ray Instrumentation for Astronomy X" (Denver, Colo., Jul. 21–23, 1999), in press.

TAKAHASHI-1994: "A Multiparametric Waveform Analysis of Ge Detector Signal Based on Fast ADC Digitizing Technique", by H. Takahashi, S. Kinjoh, J. Kawarabayashi, T. Iguchi, and M. Nakazawa, I.E.E.E. Trans. Nuclear Science, Vol. 41, No.4, (1994) 1246–1249.

WARBURTON-1997: U.S. Pat. No. 5,684,850, issued Nov. 4, 1997 to W. K. Warburton and B. Hubbard for "Method and apparatus for digitally based high speed x-ray spectrometer".

WARBURTON-1998: U.S. Pat. No. 5,774,522, issued Jun. 30, 1998 to W. K. Warburton for "Method and apparatus for digitally based high speed x-ray spectrometer for direct coupled use with continuous discharge preamplifiers".

WARBURTON-1999: U.S. Pat. No. 5,873,054, issued Feb. 16, 1999 to W. K. Warburton and Z. Zhou for "Method and apparatus for combinatorial logic signal processor in a digitally based high speed x-ray spectrometer".

WHITE-1988: "Pulse Processing for Gamma Ray Spectrometry: a Novel Method and its Implementation", G. White, I.E.E.E. Trans. Nuclear Science, Vol. 35, No. 1, (1988) 125–130.

10. Conclusion

The foregoing description of specific embodiments has been presented for purposes of illustration and description. It is not intended to be exhaustive or to limit the invention to the precise forms described, and obviously, many modifications and variations are possible in light of the above teaching. These embodiments were chosen and described in order to best explain the principles of the invention and its practical application to thereby enable others in the art to best utilize the invention in various embodiments and with such modifications as best suit the invention to the particular uses contemplated.

As a first example, while all the described embodiments used trapezoidal or triangular filters, there is no such restriction in the technique. As shown, any filter describable by a set of weighting constants applied to successive signal samples, or its analog equivalent, can be used. The method will therefore work with essentially any realizable filter. Second, while the specific embodiments employed two, three, or four filters, there is no specific limit on the number of filters which can be used. Even a single filter can be used if its output is correctly sampled at several times. If the number of filters N exceeds the number of base amplitudes M, then matrix inversion methods can be used to find least squares best estimates of the M values, rather than exact values. Third, while all the filters used in the specific embodiments were symmetric, this is not a requirement of the method, as may be seen from the derivations. Fourth, while specific configurations of electronic circuits were shown in the implementations, other configurations can readily be devised which accomplish the same functions. The number of ADC bits or value lengths captured to the registers could be varied, for example. Fifth, even the use of electronic circuits is not required to implement the method. As per the initial derivations, for example, if successive ADC values are instead read into computer memory, all the subsequent processing steps can be carried out in software. Sixth, the method can also be applied to signals which are formally equivalent to outputs from nominally single pole filters, whether the signal source is actually a single pole filter or not. Superconducting bolometers produce such output signals, for example.

Therefore, the above description should not be taken as limiting the scope of the invention, as defined by the appended claims.

What is claimed is:

1. A method for determining the integrated area $Q_{gT}$ of a pulse-like input signal by measuring a step-like output signal provided by a nominally single-pole (N-1P) device in response to said pulse-like input signal, the method comprising:

applying a filter set having one or more filters to said N-1P device output;

detecting the presence of a step-like feature in said output signal;

in response to detecting said feature, capturing a set of correlated multiple output sample values (the area cMOS) from one or more filters in said filter set; and forming a weighted sum of the sample values in said area cMOS to determine said integrated area $Q_{gT}$ (the determined area) of said input signal;

wherein the weights in said sum (the area weights) are selected to compensate said determined area for errors arising either from the time structure of said pulse-like input, or from deviations in the N-1P device's response from an ideal single-pole response, or from both.

2. The method of claim 1 wherein said pulse-like input signal has a finite time extent.

3. The method of claim 2 wherein:

both DC and long decay constant terms in said N-1P device's output signal are ignored in computing the weights used in determining the integrated area $Q_{gT}$;

a longer time constant trapezoidal filter is used primarily to estimate the amplitude of said step-like feature;

an intermediate time constant trapezoidal filter is used to estimate the device's first-pole response to prior pulse-like inputs; and a shorter time constant triangular filter is used to measure the risetime characteristics of said step-like feature.

4. The method of claim 2 wherein:

both DC and long decay constant terms in said N-1P device's output are ignored in computing the weights used in determining the integrated area $Q_{gT}$;

two longer time constant running average filters are used primarily to estimate both the amplitude of said step-like feature and the device's first-pole response to prior pulse-like inputs; and a shorter time constant running average filter is used to measure the risetime characteristics of said step-like feature.

5. The method of claim 1 wherein said N-1P device is not ideal, but has in its output a non-ideal portion characterized by a set of one or more error terms, the error terms representing one or more additional poles and/or one or more zeroes and/or a DC offset.

6. The method of claim 1 wherein the number of individual sample values in said area cMOS exceeds the number of filters in said filter set.

7. The method of claim 1 wherein the number of individual sample values in said area cMOS is equal to the number of filters in said filter set.

8. The method of claim 1 wherein the output of said N-1P device is digitized by an analog-to-digital converter, portions of the digitized output of which are transferred to a memory, and at least one of said applying a filter set, detecting the presence, capturing, and forming a weighted sum is carried out by a computer operating under software control.

9. The method of claim 1 wherein said area weights are determined analytically by:

developing a mathematical model of said N-1P device's output signal in response to said pulse-like input signal in terms of:

i) a first type (type $P_1$) parameter which is the desired integrated area $Q_{gT}$, ii) a set of one or more second type (type $P_2$) parameters which describe said N-1P device's residual amplitude response to any previous pulse-like inputs and/or its response to the finite arrival time of the present pulse-like input, the number of said type $P_1$ and type $P_2$ parameters being less than or equal to the number of sample values captured in said area cMOS, and iii) a set of one or more third type (type $P_3$) parameters which describe the transfer functions of the said N-1P device and the filters in said filter set;

describing by its weighting function each filter from which a value is captured at least once in said area cMOS;

applying said weighting function to said parameterized output model to produce a linear equation between each of the values captured in said area cMOS from said filter and said type $P_1$ and type $P_2$ parameters; and solving the resultant set of linear equations to obtain coefficients for expressing said type $P_1$ and type $P_2$ parameters in terms of the sample values of said area cMOS.

10. The method of claim 9 wherein, if a type $P_3$ parameter value is poorly known, determining its value by:

selecting a set of values for the type $P_3$ parameter which bracket its expected value;

for each member of said set of bracketing values, producing a set of coefficients expressing said type $P_1$ and type $P_2$ parameters in terms of said captured sample values;

using said set of coefficients to collect data to measure the value of said type $P_1$ parameter and determine the uncertainty in said measurement;

using said uncertainties determined for the members of said set of bracketing values to plot or otherwise parameterize said uncertainty in terms of said poorly known type $P_3$ parameter; and using said plot or parameterization to select the value of said poorly known type $P_3$ parameter which minimizes the measurement uncertainty in said type $P_1$ parameter.

11. The method of claim 1 wherein, if capturing said area cMOS would violate causality for any filter in said filter set, relative to detecting the presence of said step-like feature, increasing said filter's propagation delay sufficiently so that causality is not violated by said capturing.

12. The method of claim 1 wherein timers are used to capture values from said filter outputs as they appear so that capturing an area cMOS can be carried out asynchronously.

13. The method of claim 1 wherein additional propagation delays are added to said filters so that capturing an area cMOS can be carried out synchronously.

14. The method of claim 1 wherein said N-1P device output is digitized by an analog-to-digital converter;

the filters in said filter set are digital filters;

the outputs of said digital filters are captured into registers; and the determination of said integrated area $Q_{gT}$ is carried out by a digital computing device that reads the values captured in said registers, multiplies each such value by a weighting coefficient, and adds them together.

15. The method of claim 14 wherein said digital filters are either triangular or trapezoidal filters.

16. The method of claim 14 wherein:

a cMOS value $\sigma_\Sigma$, captured from a trapezoidal filter, is used primarily to estimate the integrated area $Q_{gT}$;

a cMOS value $\sigma_{32}$, captured from a triangular filter, is used to estimate the N-1P device's first pole residual responses to previous pulse-like inputs; and a cMOS value $\sigma_g$, captured from a triangular filter, is used to probe the risetime region of said step-like feature; and said integrated area $Q_{gT}$ is determined according to $$Q_{gT} = J_{11}^{-1}\sigma_\Sigma + J_{12}^{-1}\frac{\sigma_g}{r_1} + J_{13}^{-1}\sigma_{32}.$$

17. The method of claim 14 wherein:

a cMOS value $\sigma_\Sigma$, captured from a trapezoidal filter, is used primarily to estimate the integrated area $Q_{gT}$;

a cMOS value $\sigma_{21}$, captured from a triangular filter, is used to estimate the N-1P device's first pole residual response to previous pulse-like inputs;

a cMOS value $\sigma_{43}$, captured from a triangular filter, is used to estimate the N-1P device's second pole residual response to previous pulse-like inputs; and a cMOS value $\sigma_g$, captured from a triangular filter, is used to probe the risetime region of said step-like feature; and said integrated area $Q_{gT}$ is determined according to $$Q_{gT} = J_{11}^{-1}\sigma_\Sigma + J_{12}^{-1}\frac{\sigma_g}{r_1} + J_{13}^{-1}\sigma_{43} + J_{14}^{-1}\sigma_{21}.$$

18. The method of claim 14 wherein one or more of said digital filters is a running average filter.

19. The method of claim 14 wherein digital timers are used to measure the time intervals between said detecting a step-like feature and said capture of the individual sample values in the area cMOS.

20. The method of claim 1 wherein the need for timing precision in capturing said area cMOS relative to the position of the risetime region of said step-like output signal is reduced by:

designating a risetime probe filter whose time constant is significantly longer than the longest expected risetime;

adjusting the area cMOS capture so that the risetime regions of the N-1P device's step-like outputs will fall entirely within it; and for all other filter values that are captured, adjusting the area cMOS capture so that the weighting constants of their respective filters are negligible within said risetime region.

21. The method of claim 20 wherein if one of said other filter values is captured from a trapezoidal filter, adjusting the area cMOS capture so that the risetime region lies within its gap and if one of said other filter values is captured from a triangular filter, adjusting the area cMOS capture so that the risetime region lies entirely outside its range.

22. The method of claim 1 wherein the time of detecting said step-like feature is captured by:

connecting a digital register to the output of a digital clock; and using said detecting the presence to cause said register to load the time value of said clock at that instant.

23. The method of claim 1 wherein:

the filters in said filter set are analog shaping filters;

their output values, delayed if necessary, are captured by sample and hold circuits which are triggered by the outputs of timing circuits which are started by said detection event;

said sample and hold outputs are weighted by constants and added using an analog weight-and-add circuit or multiply-and-add circuit; and if additional pileup criteria are satisfied, the output of this circuit is shaped by an output gating circuit so that its amplitude correctly represents the desired integrated area $Q_{gT}$.

24. The method of claim 1 wherein, in addition to detecting the presence of a step-like feature, an additional test is made to see if said pulse-like input signal is piled up and, if it is, preventing both the following capture and determination from being carried out.

25. The method of claim 1, further comprising capturing the peak amplitudes of one or more filters and treating these captured values as members of the area cMOS in determining said integrated area $Q_{gT}$.

26. The method of claim 1, further comprising, when said N-1P device is not strictly a single-pole device, but has in its output a non-ideal portion characterized by a set of one or more error terms, the error terms representing one or more additional poles and/or one or more zeros and/or a DC offset:

forming a mathematical model which describes the step-like output signals from said N-1P device in terms of i) a first type (type $P_1$) parameter that is the desired integrated area $Q_{gT}$, ii) a set of one or more second type (type $P_2$) parameters that describe said N-1P device's single pole response to any previous pulse-like inputs and/or its response to the finite arrival time of the present pulse, wherein the number of said type $P_1$ and type $P_2$ parameters is less than or equal to the number of sample values captured in said area cMOS;

iii) a set of one or more third type (type $P_3$) parameters that describe said error terms, including $Q_{23}$, said N-1P device's second pole response, if any, to any previous pulse-like inputs, and $B_0$, said N-1P device's DC offset, if any;

iv) a set of one or more fixed fourth type (type $P_4$) parameters that describe the transfer functions of said N-1P device and of the filters in said filter set;

designating one or more filters in said filter set as the baseline filter set;

capturing, from time to time, one or more output values from said baseline filter set (a baseline sample); and using one or more baseline samples to update at least one type $P_3$ parameter.

27. The method of claim 26, further comprising:
using said type $P_3$ parameters to correct said integrated area $Q_{gT}$ for the effects of said error terms.

28. The method of claim 27 wherein said correction is accomplished by adding a weighted sum of said type $P_3$ parameters to said integrated area $Q_{gT}$.

29. The method of claim 28, when said set of type $P_3$ parameters includes only $Q_{23}$ and $B_0$, correcting said integrated area $Q_{gT}$ comprises:
using $\overline{A}_m^{-1}[LQ_{23}+MB_0]$ as said weighted sum of said type $P_3$ parameters,
wherein $Q_{23}$ is evaluated at a time fixed with respect to said area cMOS capture and $\overline{A}_m$, L, and M depend only upon type $P_4$ parameters.

30. The method of claim 26 wherein at least one type $P_3$ parameter update is accomplished by:
using said baseline sample to produce a new estimate of said type $P_3$ parameter; and
forming an appropriate average between said new estimate and said parameter's prior value.

31. The method of claim 30 wherein, in forming said appropriate average:
the difference between said new estimate and said prior value is recorded and averaged as well; and
this difference average is used to adjust one of the type $P_4$ parameters.

32. The method of claim 26, further comprising:
recording the time of capture of each baseline sample (time $t_i$); and
using $t_i$ in said parameter updating to compensate for said type $P_3$ parameters' variation in time, so generating a time compensated parameter model (TC-model).

33. The method of claim 32 wherein the update of an averaged estimate $<Q>$ of a time varying type $P_3$ TC-model parameter Q is accomplished by:
using said baseline sample to produce a new estimate $Q_i$ of said parameter Q at said time $t_i$; and
averaging $Q_i$ with said parameter's averaged estimate $<Q>_{i-1}$ at the prior measurement time $t_{i-1}$ to produce a value $<Q>_i$ of $<Q>$ at time $t_i$ according to:

$$\langle Q \rangle_i = \frac{N-1}{N}(b\langle Q \rangle_{(i-1)}) + \frac{Q_i}{N},$$

where N is a constant and b corrects $<Q>$ for its time variation between times $t_i$ and $t_{i-1}$.

34. The method of claim 33 wherein the type $P_3$ parameter $<Q>$ is associated with a pole having a decay time $\tau_q$ and b is given by:

$$b = \exp(-(t_i - t_{i-1})/\tau_q).$$

35. The method of claim 32 comprising, whenever the integrated area $Q_{gT}$ of a pulse-like input is determined, using $Q_{gT}$ to update said TC-model parameters to reflect changes in said error terms in response to said pulse-like input.

36. The method of claim 35 wherein:
a type $P_3$ parameter Q is associated with a pole having decay time $\tau_q$;
said time of determining said integrated area $Q_{gT}$ is denoted $t_i$;
the most recent prior time of updating Q, to the value $Q_{i-1}$, in response to capturing a baseline sample is denoted $t_{i-1}$; and
said updating of Q to value $Q_i$ to reflect changes in said error terms in response to $Q_{gT}$ is accomplished according to:

$$Q_i = \exp(-(t_i - t_{i-1})/\tau_q)Q_{i-1} + \beta Q_{gT},$$

where the type $P_4$ parameter $\beta$ is the fraction of $Q_{gT}$ which is transferred into the $\tau_q$ decay mode.

37. In the method of claim 32, further comprising:
recording, in said area cMOS capture, the time of said capture;
adjusting said type $P_3$ TC-model parameters for the elapsed time $\Delta t_i$ between said time of area cMOS capture $t_i$ and the last time $t_{i-1}$ the TC-model was updated; and
using said adjusted type $P_3$ parameters to correct said integrated area $Q_{gT}$ for the effects of said error terms.

38. The method of claim 37 wherein said integrated area correction step is carried out by:
applying a set of weights to said type $P_3$ TC-model parameters; and
adding a sum of said weighted type $P_3$ parameters to said integrated area $Q_{gT}$.

39. The method of claim 38 wherein:
said set of type $P_3$ parameters includes only $Q_{23}$ and $B_0$;
said area cMOS comprises three captured values, designated $\sigma_{\Sigma+}$, $\sigma_{\Sigma-}$, and $\sigma_g$, with $\sigma_g$ probing the step-like feature's risetime region; and
said weighted sum of said area cMOS values used to determine said integrated area $Q_{gT}$, minus said correcting weighted sum of type $P_3$ parameters, is given by:

$$Q_{gT} = \overline{A}_m^{-1}\left[\sigma_{\Sigma+} - K\sigma_{\Sigma-} + \frac{\hat{A}_m}{\hat{r}}\sigma_{g-}\right]_q - \overline{A}_m^{-1}\left[Lb_2^{\Delta t_i}\langle Q_{23}\rangle_{i-1} + M\langle B_0\rangle\right],$$

where
$\overline{A}_m$, K, $\hat{A}_m$, $\hat{r}$, L and M depend only upon type $P_4$ parameters, $\langle B_0 \rangle$ is the TC-model estimate of $B_0$, $\langle Q_{23} \rangle_{i-1}$ is the TC-model estimate of $Q_{23}$ at its time of last update $t_{i-1}$, and $b_2$ is the amount $Q_{23}$ exponentially decays per unit time.

40. The method of claim 26 wherein one or more of the filters whose output values are captured in said area cMOS are also used in the baseline filter set.

41. The method of claim 26 wherein said baseline value captures are allowed only at instants when said baseline filter set is not engaged in processing a step-like feature in the N-1P device's output.

42. The method of claim 26 wherein said baseline capture is a cMOS capture.

43. The method of claim 26 wherein:

said N-1P device output is digitized by an analog to digital converter;

the filters in said baseline filter set are digital filters;

the baseline sample is captured by capturing the digital outputs of said filters into registers; and the model parameter update step is carried out by a digital computing device which reads the values captured in said registers.

44. The method of claim 43 wherein said digital computing device carries out said correction of said integrated area $Q_{gT}$ by adding a weighted sum of said TC-model parameters to $Q_{gT}$.

45. The method of claim 26 wherein:

said one or more filters from which said area cMOS is captured is designated the area filter set;

the said area and baseline filter sets are identical;

identical correlated multiple output samples are captured from said baseline filter set (a baseline cMOS) and said area cMOS; and, additionally, said baseline cMOS captures are allowed only at instants when said baseline filter set is not engaged in processing a step-like feature in the N-1P device's output;

said area weights are also applied to the baseline cMOS values to compute null area estimates of the response of said area filter set to said one or more additional poles and/or one or more zeros and/or DC offset; and one or more of said null area estimates are used in said updating of at least one type $P_3$ parameter.

46. The method of claim 45 wherein:

said set of type $P_3$ parameters includes only $Q_{23}$ and $B_0$;

said area cMOS comprises three captured values, designated $\sigma_{\Sigma+}$, $\sigma_{\Sigma-}$, and $\sigma_g$, with $\sigma_g$ probing the step-like feature's risetime region, and said weighted sum of said area cMOS values used to determine said integrated area $Q_{gT}$ is given by:

$$Q_{gT} = \overline{A}_m^{-1}\left[\sigma_{\Sigma+} - K\sigma_{\Sigma-} + \frac{\hat{A}_m}{\dot{r}}\sigma_{g-}\right]_a;$$

values of $Q_{23}$ are obtained from said null area measurement according to:

$$Q_{23} = \frac{1}{L}\left[\sigma_{\Sigma+} - K\sigma_{\Sigma-} + \frac{\hat{A}_m}{\dot{r}}\sigma_{g-}\right]_b - \frac{M}{L}B_0;$$

where $\overline{A}_m$, K, $\hat{A}_m$, $\dot{r}$, L and M depend only upon type $P_4$ parameters, and the subscripts a and b stand for area cMOS captures and baseline cMOS captures, respectively.

47. The method of claim 1, and further comprising, when said N-1P device is not strictly an ideal single-pole device, but has in its output a non-ideal portion arising from one or more additional poles and/or one or more zeros and/or a DC offset:

designating one or more filters in said filter set as the baseline filter set;

capturing, from time to time, one or more output values from said baseline filter set (a baseline sample); and using one or more of said baseline samples to correct said determined area $Q_{gT}$ for errors arising from of said non-ideal portion of the N-1P device's output.

48. The method of claim 47 wherein:

said one or more filters from which said area cMOS is captured is designated the area filter set;

the said area and baseline filter sets are identical;

identical correlated multiple output samples are captured from said baseline filter set (a baseline cMOS) and said area filter set (i.e., the area cMOS).

49. The method of claim 48 wherein:

said baseline cMOS captures are allowed only at instants when said area filter set is not engaged in processing one of said step-like output signals from the N-1P device;

said area weights are also applied to the baseline cMOS values to compute null area estimates of the response of said area filter set to said one or more additional poles and/or one or more zeros and/or DC offset; and one or more of said null area estimates are used in said correcting of said determined area $Q_{gT}$.

50. The method of claim 49 wherein said correction of said determined area $Q_{gT}$ is carried out by:

optionally multiplying said null area estimate by a time decay factor $b^{\delta t}$, where said coefficient b describes the exponential decay of said null area per unit time and $\delta t$ is the difference between the time of the area cMOS capture and the time of the baseline cMOS capture; and subtracting said null area estimate from said determined area $Q_{gT}$.

51. The method of claim 50 wherein.

said area cMOS comprises three captured values, designated $\sigma_{\Sigma+}$, $\sigma_{\Sigma-}$, and $\sigma_g$, with $\sigma_g$ probing the step-like feature's risetime region, and said corrected area $Q_{gT}$ is given by:

$$Q_{gT} = \overline{A}_m^{-1}\left[\left[\sigma_{\Sigma+} - K\sigma_{\Sigma-} + \frac{\hat{A}_m}{\dot{r}}\sigma_{g-}\right]_a - b^{\delta t}\left[\sigma_{\Sigma+} - K\sigma_{\Sigma-} + \frac{\hat{A}_m}{\dot{r}}\sigma_{g-}\right]_n\right],$$

where the subscripts a and n label the area and null area estimates, respectively, and $\overline{A}_m$, K, and $$\frac{\hat{A}_m}{\dot{r}}$$

are said area weights.

52. The method of claim 49 wherein said correction of said determined area $Q_{gT}$ is carried out by subtracting an average of several null area estimates from said determined area.

53. The method of claim 1 wherein compensation is made for a finite time extent of said pulse-like input signal by the additional steps of:

in response to said detecting of a step-like feature, capturing a digital representation of the risetime portion of said detected step-like signal; and using a digital computing device to process the values in said representation in order to compute said compensation.

54. The method of claim 1, 3, 4, 8, 12, 13, 14, 15, 18, 19, 20, 22, 23, 32, 44, 45, 47 or 49 wherein said N-1P device is a charge sensitive preamplifier, said pulse-like input signal is a current from a radiation detector following a radiation absorption event, and said determined integrated area $Q_{gT}$ is a charge which represents the energy deposited in said detector by said absorption event.

55. The method of claim 1, 8, 14, 15, 20 or 47 wherein said N-1P device is a superconducting bolometer, said pulse-like input signal is the flow of energy following absorption of a photon in the bolometer's active volume, and said determined integrated area $Q_{gT}$ represents the energy deposited in said active volume by said photon absorption event.

56. Apparatus for measuring a step-like output signal from a nominally single-pole device (N-1P device) in response to a pulse-like input signal to determine the integrated area $Q_{gT}$ of said pulse-like input signal, the apparatus comprising:

a set of one or more filters applied to the N-1P device output (the area filter set);

circuitry that detects the presence of a step-like signal in said output signal;

circuitry that captures a correlated multiple output sample (the area cMOS) from said area filter set in response to said detection event; and circuitry that forms a weighted sum of the values in said area cMOS to determine said integrated area $Q_{gT}$ (the determined area) of said pulse-like input signal;

wherein the weights in said sum (the area weights) are selected to compensate said area determination for errors arising either from the time structure of said pulse-like input signal, or from deviations in the N-1P device's response from an ideal single pole response, or from both.

57. The apparatus of claim 56 wherein:

said N-1P device output is digitized by an analog to digital converter;

said filters in said area filter set are digital filters;

said circuitry that captures include digital registers into which the digital outputs of said filters are captured; and said circuitry that forms a weighted sum to determine said integrated area $Q_{gT}$ includes a digital computing device that reads the values captured in said registers, multiplies each such value by an appropriate weighting constant, and adds them together to compute said integrated area $Q_{gT}$.

58. The apparatus of claim 56 wherein:

said N-1P device is a charge sensitive preamplifier;

said pulse-like input is from a radiation detector following a radiation absorption event; and said determined integrated area $Q_{gT}$ represents the energy deposited in said detector by said absorption event.

59. The apparatus of claim 56, which further compensates for the finite time extent of said pulse-like input signal, the apparatus additionally comprising:

circuitry that captures a digital representation of the risetime portion of said detected step-like output feature in response to said detection event; and a digital computing device that processes the values in said representation in order to compute said compensation.

60. The apparatus of claim 56 wherein, in order to produce a prescribed set of time relationships between the members of said area cMOS, said circuitry that captures additionally includes, for each filter value to be captured, correlated sampling circuitry comprising one or more of:

a timer that fixes the time of capture relative to said detection event; or a delay element inserted between the output of said filter and said circuitry that captures; or wherein the output of a single filter may be captured more than once by the use of multiple sets of said circuitry that captures.

61. The apparatus of claim 60 wherein:

said N-1P device is a charge sensitive preamplifier;

said pulse-like input is from a radiation detector following a radiation absorption event; and said determined integrated area $Q_{gT}$ represents the energy deposited in said detector by said absorption event.

62. The apparatus of claim 60 wherein:

said N-1P device is a superconducting bolometer;

said pulse-like input is the absorption of a photon in the bolometer's active volume; and said determined integrated area $Q_{gT}$ represents the energy deposited in said active volume by said photon absorption event.

* * * * *